United States Patent [19]
Lo et al.

[11] Patent Number: 5,138,705
[45] Date of Patent: Aug. 11, 1992

[54] CHIP ORGANIZATION FOR AN EXTENDABLE MEMORY STRUCTURE PROVIDING BUSLESS INTERNAL PAGE TRANSFERS

[75] Inventors: Tin-Chee Lo, Fishkill; Arnold Weinberger, Poughkeepsie, both of N.Y.

[73] Assignee: International Business Machines Corporation, Armonk, N.Y.

[21] Appl. No.: 371,957

[22] Filed: Jun. 26, 1989

[51] Int. Cl.$^5$ .............................................. G06F 13/00
[52] U.S. Cl. ............................. 395/425; 364/DIG. 1
[58] Field of Search ... 364/200 MS File, 900 MS File; 365/189.12, 230.08, 189.05; 375/400, 425

[56] References Cited

U.S. PATENT DOCUMENTS

| | | | |
|---|---|---|---|
| 3,654,622 | 4/1972 | Beausoleil | 340/172.5 |
| 3,740,723 | 6/1973 | Beausoleil et al. | 340/172.5 |
| 4,081,701 | 3/1978 | White, Jr. et al. | 365/205 |
| 4,330,852 | 5/1982 | Redwine et al. | 365/205 |
| 4,476,524 | 10/1984 | Brown et al. | 364/200 |
| 4,491,910 | 1/1985 | Caudel et al. | 364/200 |
| 4,577,293 | 3/1986 | Matick et al. | 365/189 |
| 4,586,131 | 4/1986 | Caudel et al. | 364/200 |
| 4,639,894 | 1/1987 | Ishii | 365/189.12 |
| 4,641,276 | 2/1987 | Dunki-Jacobs | 364/900 |
| 4,667,313 | 5/1987 | Pinkham et al. | 365/240 |
| 4,725,945 | 2/1988 | Kronstadt et al. | 364/200 |
| 4,731,738 | 3/1988 | Fisher et al. | 364/200 |
| 4,731,758 | 3/1988 | Lam et al. | 365/189 |
| 4,796,231 | 1/1989 | Pinkham | 365/189.12 |
| 4,807,189 | 2/1989 | Pinkham et al. | 365/189.05 |
| 4,855,957 | 8/1989 | Nogami | 365/230.08 |
| 4,926,385 | 5/1990 | Fujishima et al. | 365/230.08 |

OTHER PUBLICATIONS

IBM TDB vol. 19, No. 8, Jan. 1977, 3071-3073, by Aichelmann, Jr. et al, "Hierarchy Memory For Improved Microprocessor Performance".
IBM TDB vol. 24, No. 1B, Jun. 1981, 485-488, by Aichelmann, Jr., "Paging From Multiple Bit Array Without Distributed Buffering".
IBM TDB vol. 26, No. 12, May 1984, 6473-6475, by R. C. Tong, "Memory Transfer At Arbitrary Byte Boundaries".
IBM TDB vol. 31, No. 2, Jul. 1988, 98-100, by T. C. Lo, "Integrated L3/L4 Concept".

*Primary Examiner*—Terrell W. Fears
*Assistant Examiner*—Reba I. Elmore
*Attorney, Agent, or Firm*—Bernard M. Goldman

[57] ABSTRACT

A memory structure is described as comprised of a large number of fixed-size page frames. Each page frame in the memory is spread among all chips in the memory. The size of the memory structure may be extended or expanded by adding the same type of high-capacity chip originally used to construct the memory. (The chips may be constructed of semiconductor DRAM technology.) When the memory is extended/expanded, the fixed-size page frames have their lateral dimension decreased and their length increased, in accordance with the increase in the number of chips in the memory. A shift register on each chip accommodates the moving of pages within the memory structure as the page-frame shape and the redistribution of the page frame locations in the memory are changed when the number of chips in the memory structure is changed, without requiring any change in the internal structure of the chips. A page of data can be moved in two dimensions between any page frames within the memory structure without using any external bus, even though the size of the memory structure is changed. No bit in a page is moved off of its chip during a page move operation. All bits in a page are accessed and moved logically in parallel. Extremely fast page transfer rates are obtainable by the busless page move operations. Special addressing is provided that accommodates both the internal page move operations and data unit accesses in the memory structure for an external memory bus. Multiple logical memories can be accommodated in the memory structure.

36 Claims, 13 Drawing Sheets

(PAGE MOVE)

FIG.5 SHIFT-CONTROL LOGIC (SCL)

FIG. 7 PARALLEL SHIFTING OF 4 BITS/SHIFT

FIG. 9 SUBTRACTER 61

FIG. 10

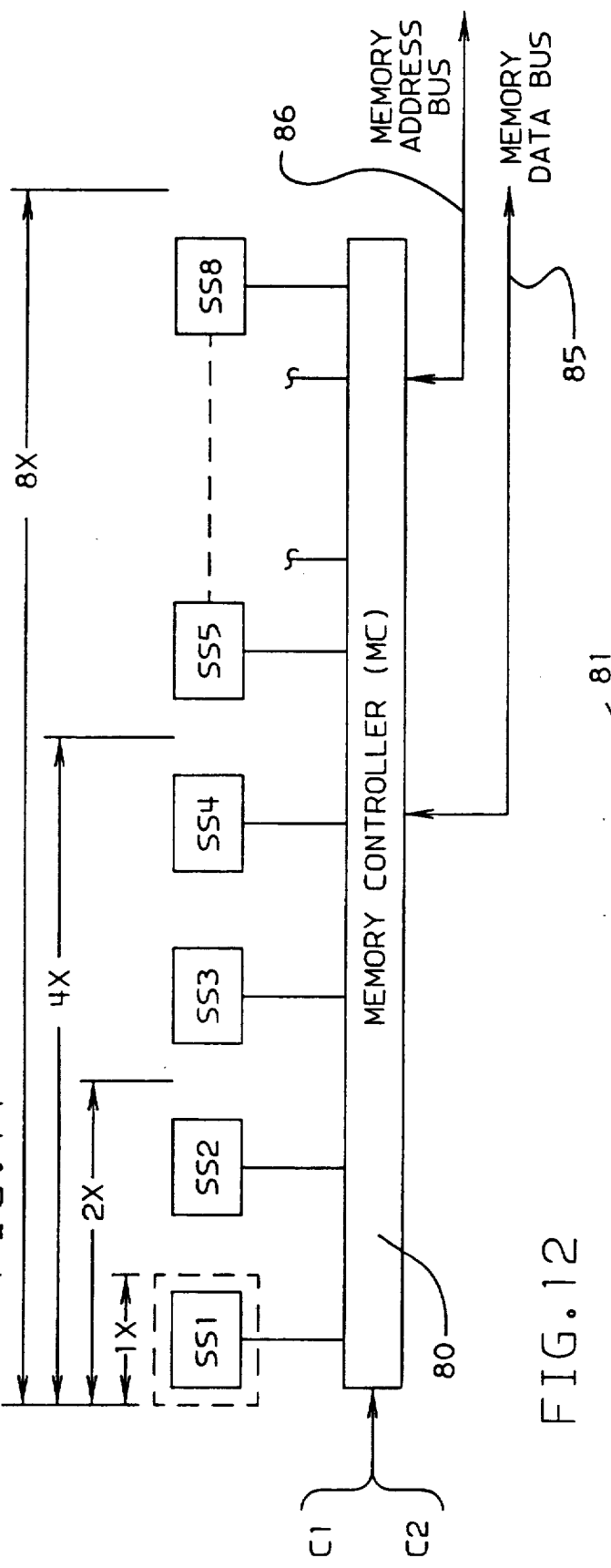
FIG. 11 MEMORY STRUCTURE
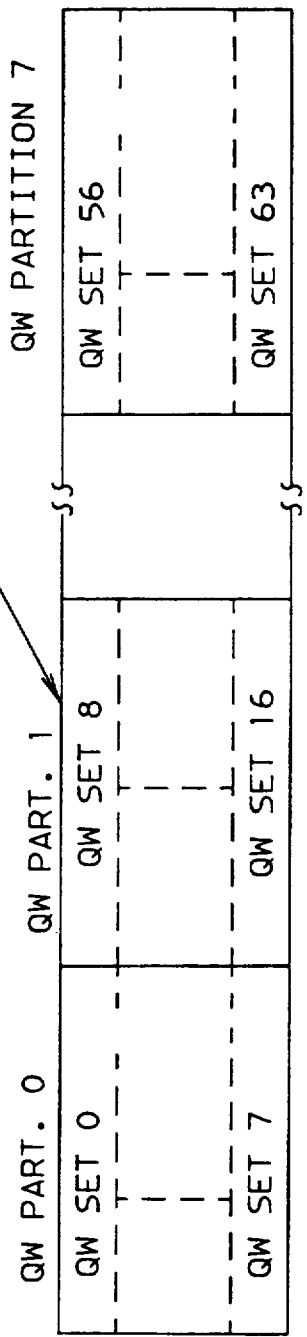
FIG. 12

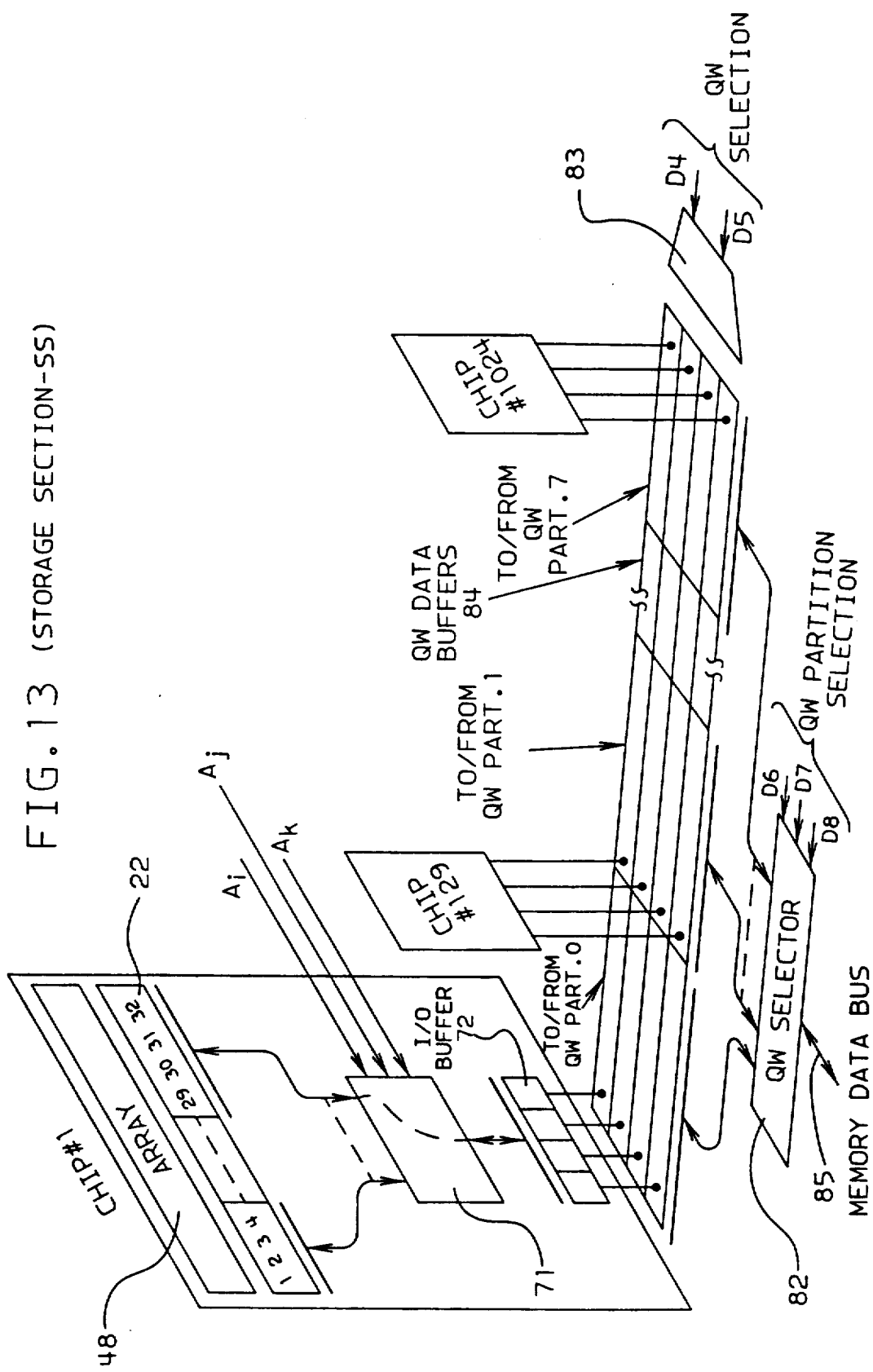

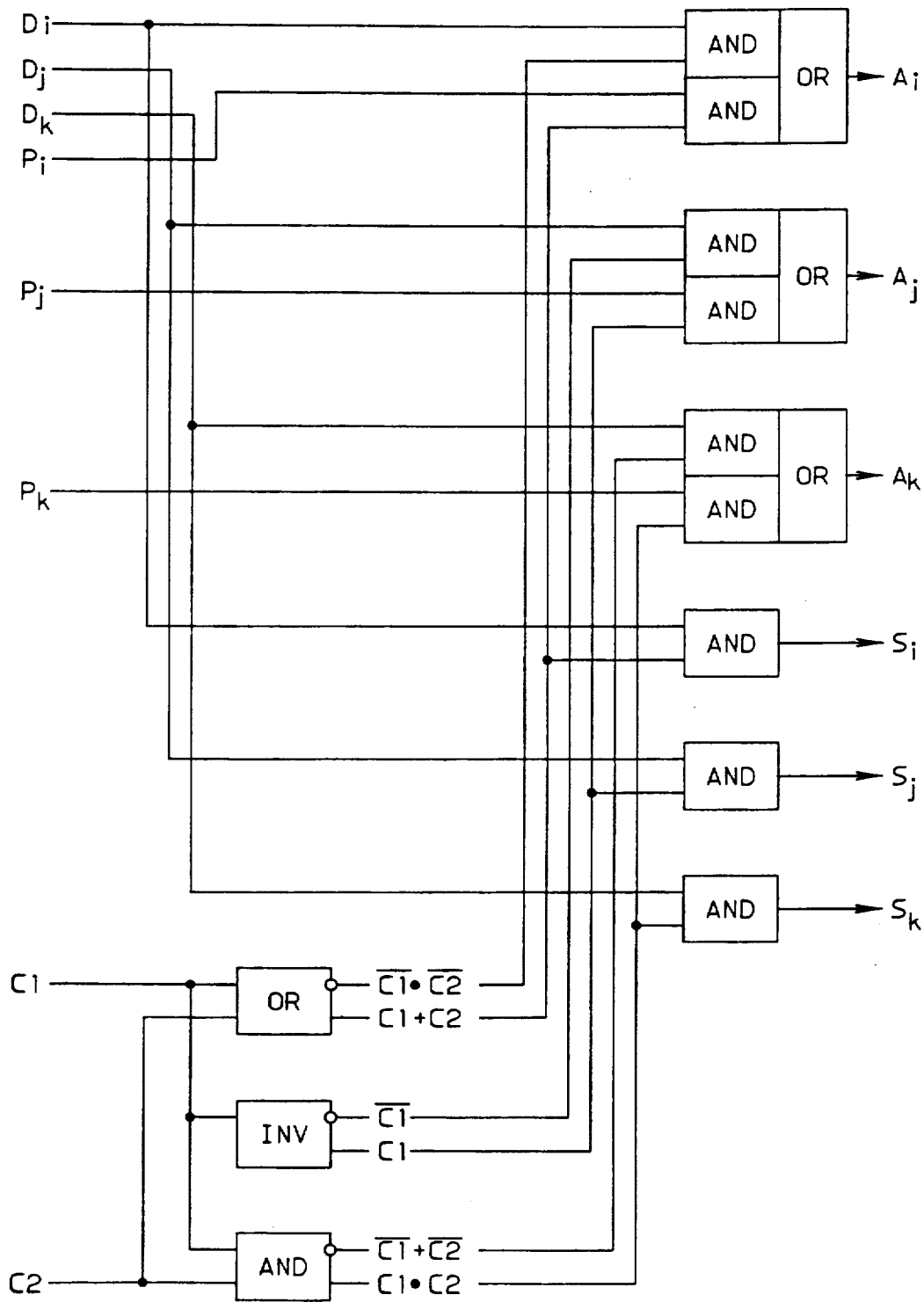
FIG. 14 A BIT & S BIT DEFINITION CIRCUITS 76

CHIP ORGANIZATION FOR AN EXTENDABLE MEMORY STRUCTURE PROVIDING BUSLESS INTERNAL PAGE TRANSFERS

INTRODUCTION

This invention deals with the internal organization of circuits in a type of semiconductor chip that enables the addition of more chips of the same type for extending or expanding the size of a page-frame structured memory. Pages are moved parallel-by-bit internal to the memory structure. The term, extended memory, is sometimes used to mean a variable size main memory of a computer system made of RAM chips and addressed as a unit. And the term, expanded memory, is sometimes used to mean a backup memory for the main memory also made of RAM chips but addressed independently of the main memory. Both of these terms may be applied to the subject invention, since its variable size memory structure may be logically apportioned in any manner to either or both of an extended main memory and/or an expandable backup memory. The terms, extendable memory and expandable memory, are used interchangeably herein to mean either or both of these types of memories, which are logical concepts that may be applied to the subject invention.

BACKGROUND

Conventional memories use an external bus of restricted width to move a data page in small portions at a time between corresponding locations in different page-frames in a memory. Such conventional memories are currently used in microcomputers, minicomputers and large computers.

Conventional computer systems have long had a processing unit (PRU) having registers and logic circuits external to the main memory, with the PRU receiving and manipulating the bits in a byte or word(s) accessed in the memory. The PRU functions included adding, shifting, etc. After any manipulation, the PRU often transfers the data back to the memory, which may be to a different memory location than the location from which the data was originally accessed. Data is commonly shifted by the PRU externally of the memory to align the data across block boundaries within the memory. Data could also pass unchanged through the PRU during the process of moving data from one memory location to another memory location.

An external bus was required by such prior computer systems to transfer each unit of data (byte or words) between the memory and the PRU before putting the manipulated data back into the memory, often to a different chip than the chip from which the data was fetched.

Any PRU shift function was not capable of directly changing the location of data within the memory. At most, memory address values (received by the PRU on the external memory bus) could be manipulated by the PRU before being sent to the memory on the bus for use as conventional memory addresses.

The external busing resulted in slow memory operation because of the limited external bus width which limited the number of bits that could be handled simultaneously in parallel. This bus width constraint is sometimes referred to as a bandwidth limitation on the memory operation, because it slowed the computer operation. For these and other reasons, prior computer memories were incapable of operating in the manner of the subject invention.

Input/output pins connect memory chips to the external bus. The I/O pin number is limited on each memory chip, thereby limiting the number of bits that can be simultaneously transferred to the PRU for instruction-controlled operations in a computer system. Conventional computers execute all intra-memory data move operations (including page moves) by transferring the data to the external bus and through the PRU. For example, a common operation in the IBM S/370 computer is the moving of one or more pages (4096 bytes or 32,768 bits per page) to different page-frame location(s) in the memory using a Move Character Long instruction, for which a PRU has used a sequence of bus-limited move operations external to memory to move each page of data, so that a page could not be moved in one parallel operation. Each page move operation is broken into a number of serial submove operations, each submove operation transferring a bus-width limited number of bits, which is not a restriction on page moves with the subject invention.

Conventional computer memories are currently made of random access memory (RAM) semiconductor chips. Conventional memories are easily extendable by adding chips to the old memory chips. The old chips were retained when extending the memories.

Such conventional memories have addressability-control switches which must have their addressability settings changed when chips are added for increasing the size and addressability of the memory.

U.S. Pat. No. 4,476,524 to D. T. Brown et al entitled "Page Storage Control Method" describes the use of an external bus for moving page units in bus-width limited groups of bits between an expanded storage (L4) and a main storage (L3).

An article by T. C. Lo (one of the inventors of the subject invention) entitled "Integrated L3/L4 Concept" is in the IBM TDB on page 98, volume 31, Number 2, dated July 1988. This article (which does not disclose the claimed invention in the subject application) discloses a memory structure which included both L3 and L4 memories to obtain non-bus page transfers between L3 and L4 memories. But the disclosed memory structure could not be changed and maintain an internal L3/L4 memory page transfer, since an external bus would be required for internal page transfers if chips were added to the memory structure (unlike the subject invention).

U.S. Pat. No. 3,654,622 deals with a memory system comprised of a 2-dimensional array of shift registers and the concurrent selection of two adjacent shift registers, to cross word boundaries and avoid the loss of time entailed in switching to the next adjacent shift register.

U.S. Pat. No. 3,740,723 to Beausoleil et al entitled "Integral Hierarchical Binary Storage Element" discloses memory chips using 2-dimensional addressing which may have a shift registers at the intersections of the 2-dimensional address selections. Also, shift registers are disclosed for outputting data to a buffer store. A page-move operation entirely internal to a chip cannot be done in this patent similar to the manner it is done by the subject invention.

An article in the IBM TDB January 1977 at page 3071 by F. J. Aichelmann, Jr. and N. M. DiPilato entitled "Hierarchy Memory for Improved Microprocessor Performance" discloses a page store chip hierarchy.

An article in the IBM TDB June 1981 at page 485 by F. J. Aichelmann, Jr. entitled "Paging From Multiple Bit Array Without Distributed Buffering" discloses a full page buffer in a controller.

An article in the IBM TDB May 1984 at page 6473 by R. C. Tong entitled "Memory Transfer at Arbitrary Byte Boundaries" disclosed the use of one or two shift registers external to the chips comprising a memory, for which the shift registers performed an PRU function of reordering the bit sequence in a byte location in the memory, by transferring the byte on a bus from the memory to the register, reordering the bits in the byte, and writing the reordered byte back into the memory.

U.S. Pat. No. 4,577,293 to Matick et al discloses a distributed cache located on the same chips as the main system memory. Data is transferred to a second port from the memory by first being moved on the same chips in a single cycle from the cache to the second port, which sends the bits to a CPU. Bits from the CPU are received at the second port and put into the cache in one or more cycles, and the cache data is moved into the memory on the same chips in a single cycle.

U.S. Pat. No. 4,491,910 to Caudel et al entitled "Microcomputer Having Data Shift Within Memory", and U.S. Pat. No. 4,586,131 to Caudel et al entitled "Microcomputer Having Data Move Circuits For Within-Memory shift of Data Words" have the same specification. They disclose the subject matter of the following claim limitation: "shift means moving an entire data word in the memory from one location to another location having an adjacent address". The disclosure does not appear to have the capability of moving a data word to any location in the memory using the shift means.

U.S. Pat. No. 4,641,276 to Dunki-Jacobs disclosed a data communication method and means for transferring data in parallel to a source register, serially shifting the data from the source register to a destination register, and then transferring the data in parallel to another functional unit.

U.S. Pat. No. 4,667,313 to Pinkham et al uses a shift register to access a row of bits obtained from a memory bus to be serially accessed at a tapped position in the shift register.

U.S. Pat. No. 4,725,945 to Kronstadt et al entitled "Distributed Cache in Dynamic RAMs" discloses a cache memory chip arrangement using fast-registers within the chips. No page move operations appear to be disclosed.

U.S. Pat. No. 4,731,758 to Lam et al discloses separate arrays on the same chip connected through a transfer gate.

None of the above cited prior art suggests the claimed subject matter in the subject application.

Prior memories generally required the use of an external bus in order to move a page between internal memory page locations. The prior memories could accommodate 4 kilobyte (KB) page sizes, but such memories were not generally organized as page-type memories, even when they were commonly used to move pages of data. Prior computer systems generally allowed for a range of memory sizes from a minimum to a maximum in the organization of their random access memories without any special consideration for the page operations in the memories. Extension of the prior memories from a minimum to a maximum size allowed the addition of new chips to the old chips in the memory. The prior memories may be made of a DRAM chips having a single or multiple types of internal chip organization.

SUMMARY OF THE INVENTION

It is an object of this invention to buslessly move any page of data entirely internal to an extendable memory. All bits in any page may be moved simultaneously and in parallel between any page-frames in the memory. Any bit in a moved page is moved to its corresponding location in another page-frame. An external bus transfer may be used to move bits of data to non-corresponding locations within the same or different pages in the memory.

It is another object of this invention to provide a plurality of logical memories, and to provide busless page moves between the logical memories. For example, a main memory (e.g. L3) and an independently addressed backup memory (e.g. an expanded memory L4) may both be contained within the same memory structure provided by the subject invention. The separate addressing for the two independent logical memories is controlled by a memory controller for the memory structure.

It is still another object of this invention to move a page between any page-frames in a memory, or between different logical memories, without being constrained by any bus width limitation, or any chip input/output pin-number limitation.

It is still another object of the invention to enable the data capacity (size) of a page-type memory to be increased by adding more memory chips of the same type as originally used to fabricate the memory. (The chips may for example be constructed of semiconductor DRAM technology.)

It is a further object of the invention to provide a memory which is logically comprised of a large number of fixed-size page frames, in which each page frame in the memory may be spread among all chips in the memory, and each fixed-size page frame has its lateral dimension decreased and its length increased, when the memory is extended.

It is a still further object of this invention to provide a shift register on each chip that accommodates a change in the internal shape of the page frames with a change in the number of chips in the memory.

It is another object of this invention to provide an internal organization for each chip in a memory that enables the extension of the memory by the addition of chips having the same internal organization.

It is a further object of this invention to move a page of data between any page frame locations within the memory, or between logical memories, without any bit in the page moving off of its chip during the move operation. All bits in a page may be accessed and handled in parallel. Extremely fast page transfer rates are obtainable.

It is another object of this invention to provide a memory structure that does not use any bus for moving the data in a page from one page frame to any other page frame in the memory.

It is still another object of this invention to provide a page frame type of memory structure that may contain plural logical levels of a memory hierarchy that require fast moves of all bits in a page simultaneously and in parallel, from any page frame in one hierarchy level to corresponding bit locations in any other page-frame in another hierarchy level, without having any bus connected between the hierarchies to cause any bus-width constraint, and without any input/output pin number constraint.

It is a further object of this invention to allow external access on a parallel-by-bit basis of up to an entire page of data in the memory.

DESCRIPTION OF THE DRAWINGS

FIG. 10 adds input/output selector logic to the shift register to obtain external access to the memory chip used in the preferred embodiment.

FIG. 11 represents a memory controller (MC) for controlling the addressing of data within an extendable memory structure in the preferred embodiment.

FIG. 12 represents a view of the QW sets in any plane of a QW partition in a storage section (SS) of the memory structure.

FIG. 13 represents a three dimensional view illustrating how the chips in the memory structure may connect to QW data buffers for providing a QW selector to funnel data transfers between the memory structure and a memory data bus.

FIG. 14 represents A bit and S bit definition logic circuits located in the memory controller.

DETAILED DESCRIPTION OF THE EMBODIMENTS

MEMORY PAGE ORGANIZATION

In the detailed embodiments in this specification, it is assumed that the page size is 4096 bytes per page (e.g. 32768 bits), with 8 bits per byte plus any optional parity and/or error correction bits. Although discussions herein generally ignore parity and/or error correction bits, they may be included in any final design using this invention, which will be readily apparent to those skilled in the art.

The semiconductor chip size usable by the preferred embodiment can have any size, such as the 256K bit chip, or 1 Mb, 2 Mb, 4 Mb, 8 Mb, 16 Mb, etc. storage capacity. Whatever size chip is used, the preferred embodiment assumes the memory structure occupies the dimensions x, y and z. The z dimension is determined by the number of chips in the memory structure. For example, the z dimension may have 1024 chips. The x and y dimensions are found on each chip in which each chip has a storage capacity of C number of bits. The x dimension is assumed to have 32 bit groups. The y dimension then has C/32 number of bits. For example with a x dimension of 32 bits, a 4 Mb chip will have a y dimension of 4,194,304/32=131,072 groups, or a 16 Mb chip will have a y dimension of 16,777,216/32=524,288 groups.

The choice of 32 bits in the x dimension allows a page of data to be moved from any source location in the memory to any destination page location in the memory by moving not more than 32 adjacent bit positions internal to each chip in the memory. No bit in any moved page is sent to any bus. Actually, any power of 2 can be used as the number of bits in the x dimension, with 32 being selected for the preferred embodiment.

Figure 1:
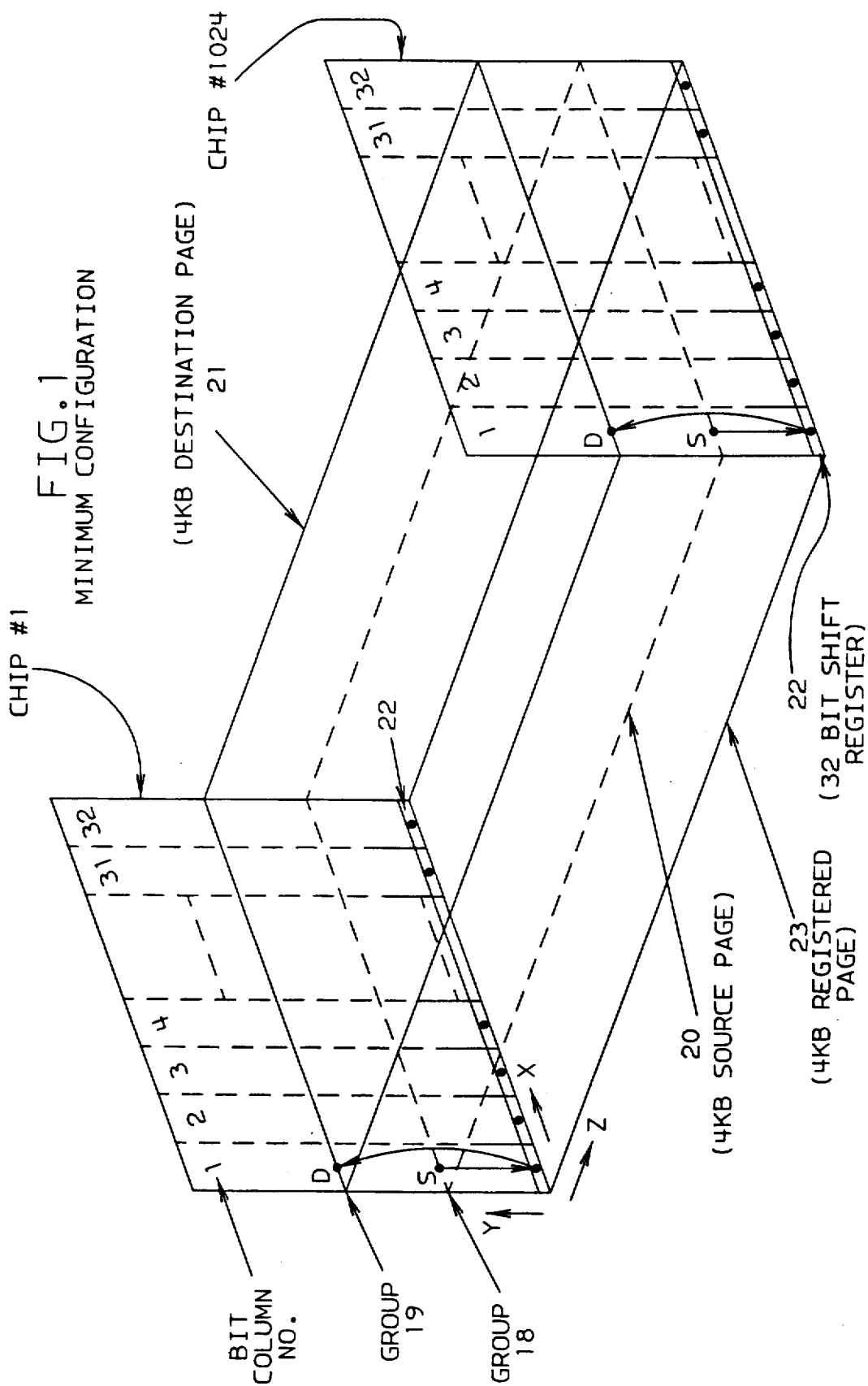
FIG. 1 represents the form of each page frame in a minimum size memory in the preferred embodiment.

FIG. 1 shows such an arrangement in which each chip 1 through 1024 contains a large number of 32 bit groups, each group being considered to extend 32 bits in the x dimension. Memory decoder addressing circuits (not shown in FIG. 1) select one of the 32 bit groups at a time occupying one row of each of the 1024 chips in the memory (at the same y dimension location on all chips in the memory). Thus, all 32 bit groups at the same y dimension can be considered in a single plane (in the x, z dimension) in the memory for each 32,768 bit page frame location 21. Thus a page of data in any page-frame location (in any plane) may be selected in the memory by addressing a 32 bit group at the same y location on every chip in the memory of FIG. 1.

Memory decoder addressing circuits (not shown in FIG. 1) may be included on each chip to avoid the problem of requiring an excessive number of I/O pins on each chip to handle a decoded selection signal to a very large number of groups. For example, when using 1M bit chips, each chip has 1,048,576/32=32,768 groups of 32 bits in FIG. 1. One pin per group is not practical with the small physical size of current semiconductor chips. If the address decoding is internally done on each chip, any of the 32,768 groups can be selected using only a 15 bit address, requiring only 15 pins per 1 Mb chip for selecting any group 18 along its y dimension. Accordingly, the use of a 4 Mb chip provides a chip capacity of 131,072 groups of 32 bits, requiring 17 pins per chip. The use of a 16 Mb chip provides a capacity of 524,288 groups of 32 bits, requiring 19 pins per chip, and so on for each different size chip.

FIG. 1 represents a minimum-size memory structure in the x, y, z dimensions for the invention. The memory is minimum size because each of its page frames occupies an entire x, z plane. The page frames are all in a single stack in the y dimension.

Any page of data (page) in any page frame can be moved to any other page frame in the memory structure of FIG. 1 using an internally contained shift register 22, shown at the bottom of each chip in the memory structure. The shift register can receive or send bits from or to any selected group on its chip. The sending group is called the source group, and the receiving group is called the destination group on its chip. Likewise, each source group is in the source page frame, and the destination group is in the destination page frame.

A page-move operation in FIG. 1 involves selecting a source group 18 of each chip in the memory. All of these addressed source groups on all chips define a selected source page frame 20. The data in the source group on every chip (which is the source page) is simultaneously copied into the shift register 22 at the bottom of each chip. Each bit in the source group is copied into a corresponding register bit position in the same bit-column at the bottom of the same chip. The copied source groups in the registers of all chips in the memory comprise the registered page 23 in all shift registers, which is a transient page location existing only during the page-move operation.

Then a destination group 19 is selected on each chip. The selected destination groups on all chips in the memory comprise the addressed destination page frame. The registered group at the bottom of each chip is then copied from the register to the addressed destination group. Each bit in the registered group is copied into a corresponding destination group bit position in the same bit-column. Thus all addressed destination groups (when taken together) comprise the destination page frame 21 which is the recipient of the moved page.

The page-move operation occurs parallel-by-bit on every chip in the memory, from the source page frame to the temporary registered page and then to the destination page frame. Each bit in the moved page remained in the same column on its chip throughout the page move operation. The speed of moving an entire 4 KB page is equal to the speed of moving one bit from a source address to the register bit position in the same column on the chip, and then moving the bit from the register to the destination address in the same column on the chip in FIG. 1.

Thus, the source address is provided and accessed followed by the destination address being provided and accessed on each chip, resulting in a transfer of a page of data in the memory structure from the source address to the destination address. If the move time from the source address to the register is 50 ns and the move time from the register to the destination address is 25 ns, the total page move time is 75 ns. The second move time may be shorter than the first move time due to internal chip operating characteristics.

Figure 2:
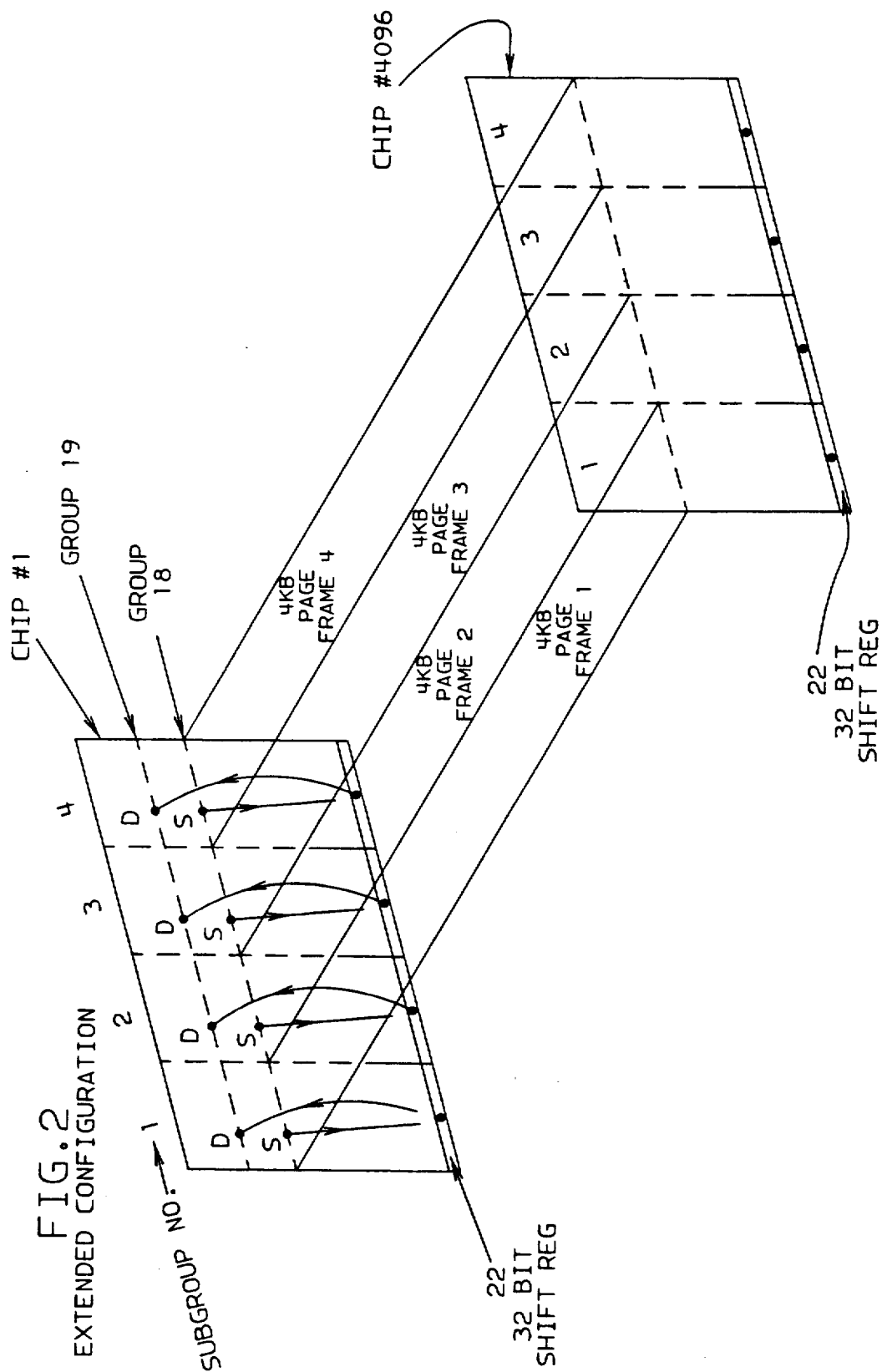
FIG. 2 represents the form of each page frame in an extendable size memory in the preferred embodiment.
Figure 3:
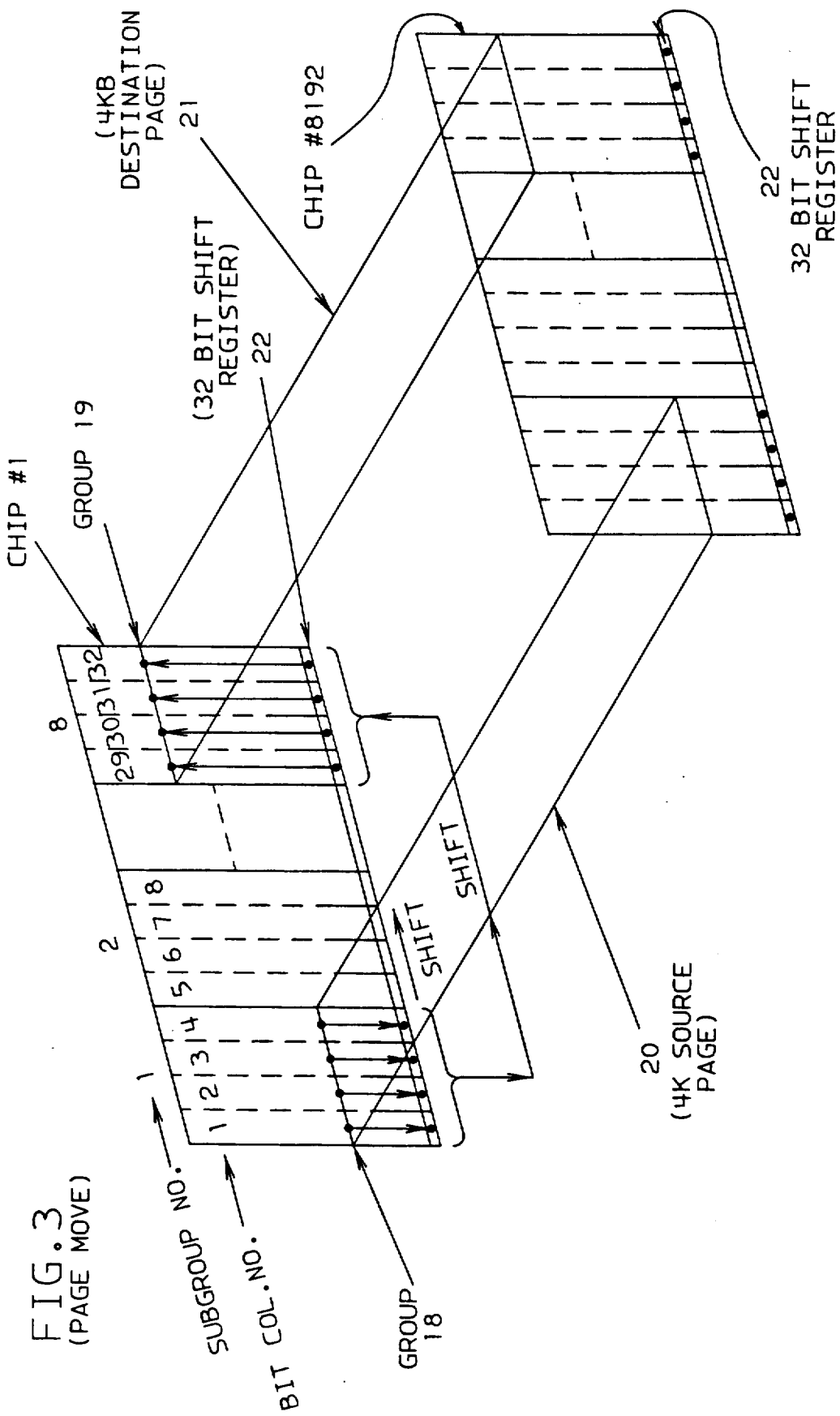
FIG. 3 illustrates the shift concept for moving pages of data between different page-frame locations in the preferred embodiment.

The optimal memory size for the detailed embodiment is variable in powers of 2, with the minimum size memory having its page frames occupy an entire x,z plane in the memory structure, as shown in FIG. 1. For a larger size memory structure, the same chip used in FIG. 1 may continue to be used for the larger memory structures, such as represented in FIGS. 2 and 3. If the minimum size memory is constructed of 1024 number of 1 MBit chips, then the next preferred size for this memory structure will contain 2 times ($2\times$) the 1024 number of chips, which is 2048 chips of the same type using 32 bit groups on 1 MBit chips.

No shifting is done by any shift register for moving any page from a source to a destination address in FIG. 1, in which the shift register operates in a static non-shifting manner. Nevertheless, the shift register is required on each chip in the $1\times$ size memory in order to allow future extension of the memory structure using the same type of chip.

Thus, the memory size may be extended to 2 times ($2\times$) the minimum number of chips, then to $4\times$, $8\times$, $16\times$ etc. The limit on the number of chips in the memory is reached when the number of chips equals the number of bits in a page frame; then each page in the memory will occupy only a single line of bits in the z dimension. All of these memory sizes assume the same group size is used for all chips in the allowed memory extensions, for example 32 bits per group, with the same internally configured chips used throughout a memory and in all of its extensions.

For each memory size greater than the minimum size, each plane in the memory structure will contain more than one page frame, in which every page frame always occupies the entire z dimension of the memory. Then the number of page frames within each plane in the memory structure will increase in powers of 2 as the memory size increase to $2\times$, $4\times$, $8\times$, $16\times$, etc. That is, the number of pages increases in the x dimension of each plane as the number of chips is increased in powers of 2.

FIG. 2 shows a $4\times$ extended memory (having four page frames 1, 2, 3 and 4 per plane). Each of these page frames is positioned in a different set of columns on the chips, unlike in the minimum size memory of FIG. 1. Lateral movement in the x dimension is needed for some page-move operations in all extended memories. This lateral page movement is provided in the invention by the shift register at the bottom of each chip. This is why the minimum size memory in FIG. 1 is required to have a shift register at the bottom of its chips, instead of a static register.

A consequence of this extendable/expandable memory organization is that the number of bits/page/chip varies with the memory size. For example, the minimum size memory uses all 32 bits in each group per page per chip. But a maximum size memory will use only 1 bit per page per chip. Thus each page frame in an extended memory uses less than the bits in a group for each page, and the number of bits per page per chip is called a subgroup. The memory sizes greater than the minimum will have 1, 2, 4, 8, or 16 bits per subgroup for each page represented within each 32 bit group.

Thus in FIG. 1 and FIG. 2, the two different memory sizes have 32 bits per group on each chip. But in FIG. 1 there are 32 bits per page on each chip, but in FIG. 2 the memory size is increased from $1\times$ to $4\times$, i.e. from 1024 to 4096 chips (by adding 3072 chips of the same type to the $1\times$ memory) to provide 8 bits per page on each chip using the same 32 bit groups.

If a static register were used instead of the shift register on each chip in a memory, no memory extension is obtainable using the same type of chip. For example, if the number of chips in such memory is quadrupled ($4\times$), as in FIG. 2, the size of each x,z plane in the memory is quadrupled to accommodate the same page size (e.g. 32,768 bits) With a static register, a page could only be moved in the y dimension shown in FIG. 1, when using the same type of chip. Memory extension can not occur in either the x or y dimensions, because then the same type of chip could not be used, which would prevent use of the original chips used in the memory structure before the extension. Internal memory page movement of every page (with its inherent speed) then becomes impossible. Page movement in the z dimension requires use of an external bus because the bits must be moved to different chips. A major problem with such external bus is that it would have to be rewired every time the memory is extended (e.g. extending to a $8\times$ memory), and bus switching would have to be provided in a very complex manner. Such external busing may be an intolerable burden and may obsolete the original chips in the memory structure. Thus, using static registers kills the extension of memories using the same chip type.

But with this invention, no external bussing is used for page moves within the memory structure. All page moves are done by only moving the bits on the same chip. Thus, the invention avoids external busing for page moves, which is a slow and complex operation.

With this invention, the same internal organization is used for all chips within a paged memory. That is, all of the chips are internally the same in both the minimum memory in FIG. 1 and in all supported extended/expanded memories, such as in FIGS. 2 and 3.

Hence, any subgroup of page bits can be moved to a different subgroup column on a chip by: Read copying an addressed plane subgroup on each chip to a corresponding subgroup column position in the shift register on the same chip, shifting the registered subgroup to any other subgroup column position, and write copying the shifted subgroup from the shift register to a corresponding subgroup column position in any plane being addressed on the chip.

Alternatively, the read copying operation may be done (if it can be done more simply) by copying the entire addressed source group of 32 bits into the shift register on the same chip, shifting the registered group by an amount that shifts the subgroup of interest to a required subgroup column position, and write copying only the required subgroup of interest to an addressed subgroup in an addressed plane.

For example in an 8× size memory, each group of 32 bits is divided into 8 subgroups of 4 bits per subgroup. This subgrouping enables each of 8192 chips to provide 4 bits in a page. Then there are 8 different page locations side-by-side in each plane in the memory structure, since the different subgroups each provide a different page frame location.

Then a page move operation selects a source 4 bit subgroup (addressed by X and Y address decoders) which can be in any of the eight different lateral subgroup positions in any plane (group), since in this example 8 different pages are located side-by-side in each plane. The selected 4 bit source subgroup is read copied into the corresponding subgroup column position in the shift register on the chip. The subgroup in the shift register is then aligned, by shifting if necessary, with the subgroup column position of the destination subgroup. And the registered subgroup is write copied into the corresponding subgroup column position of the destination plane (group).

This subgroup transfer involves moving 4 bits on every chip in the memory to move an entire 4 KB page.

The maximum size memory moves 1 bit on each chip for a page move operation. Thus, if the memory uses 1 MBit chips, the maximum size memory would have 32,768 chips (plus chips for parity and any extra bits per data unit) to provide a memory capacity of 4 Giga-Bytes. If larger chips are used the maximum memory capacity increases accordingly. For example, use of 16 MBit chips provides a maximum memory capacity of 64 GBytes.

It must be understood that the described page planes are conceptually shown in the drawings of the memory structure to enable an understanding the inventive concepts described herein. The actual physical locations of the subgroups that comprise the planes of a page frame on the chips need not be, and in most cases will not be, in physically constructed planes. But the groupings of the subgroups in the memory structure can always be considered to be in logical planes, which are most easily depicted in the drawings as physical planes.

VERSATILE CHIP ORGANIZATION

This invention provides a versatile chip organization using a shift register to enable different bit subgroupings within each group of bits on each chip in a page memory designed to handle a fixed size page, e.g. 4 KBytes. As a consequence, a single chip type can be used to obtain different sizes for a page memory, which can vary between specified minimum and maximum memory sizes. Thus the same manufactured chip design can be used to extend the memory size at a future time without throwing away existing memory chips.

The preferred embodiment provides memories which preferably vary in size by powers of 2. Extending such memory adds chips to increase the total number of chips in the memory to a higher power of 2. For example, a memory having 1024 chips may be extended to 2048 chips (2× expansion), or it may be extended to 4096 or 8192 chips (4× or 8× extension). The extension increases the number of pages located in each plane in the logical memory structure by the extension factor. That is, a 2× memory has 2 pages in the x dimension in each plane, a 4× memory has 4 pages in the x dimension in each plane, etc. Memory extension/expansion can retain all existing chips in the memory.

In a minimum size memory shown in FIG. 1, the group and subgroup are the same, e.g. 32 bits in the x dimension occupying the entire x dimension of the plane having each page frame in the memory.

But in the non-minimum size memory, the subgroup is different from the group, e.g. each subgroup occupying 8 bits in the x dimension of FIG. 2 which is one-fourth of a 32 bit group, providing four page frames in the x,z dimensions for each plane of the memory. Hence, the invention enables the increase in the number of page frames in each plane by dividing each group into a plurality of subgroups (power of 2) for each page frame on each chip of a memory structure.

Although each chip used by the invention has an address decoder to address any group on any chip in the memory (i.e. any plane), the address decoder does not uniquely address a required subgroup.

With the invention, subgroup addressing is added for use with group addressing. The subgroup addressing is done orthogonally on each chip to the group addressing. Each of these types of addressing may be done by separate address decoders, a group (plane) address decoder operating in the y dimension of a chip, and a subgroup address decoder operating in the x dimension of the chip. The group decoder addresses an x,z plane having one or more pages at the same group address. The subgroup decoder addresses the x dimension to select a particular page in a plane which may have plural pages located side-by-side along the x dimension in the same groups.

FIG. 3 shows a page move operation in an 8× memory configuration. A page-move operation in FIG. 3 first involves providing a source address 18 to each chip in the memory, which selects a required group address in the y dimension and selects a required subgroup address in the x dimension within the selected group on the chip. This subgroup addressing is applied to a subgroup-column through all groups on all chips in the memory for selecting the required source page frame. Hence, by addressing the source subgroup on each chip, the source page frame is selected.

All bits in the addressed source subgroup on each chip are copied into respective shift-register bit positions in the same columns. (Each bit position in any group of each chip may be considered to define a bit-column on the chip.) The addressed source subgroups are copied into a subset of bit positions in the shift register 22 on each chip in the memory to provide a registered page, which is a transient page existing only during the page-move operation.

Then a destination address 19 is provided to each chip in FIG. 3 to address a destination group in the y dimension and a destination subgroup in the selected group in the x dimension on each chip. The addressed destination subgroups on all chips in the memory comprise the addressed destination page frame.

A determination is made of the number of subgroup shifts required to move the registered page from the source subgroup column to a destination subgroup column. The registered subgroup in the shift register is then shifted according to the determination, putting each registered subgroup at the destination subgroup column position.

Then the registered subgroup is copied from the shift register to the addressed destination subgroup. Thus, each bit in the registered subgroup is copied into the destination subgroup's bit positions by bit transmission in the respective bit-columns. All of the copied destination subgroups (when taken together) comprise the destination page frame which is the recipient of the moved page.

The page-move operation occurs parallel-by-bit on every chip in the memory, from the source page frame to the temporary registered page which is shifted as a unit to the destination subgroup-column on each chip where it is copied as a page unit into the destination page frame. Each bit in the moved page remained on the same chip throughout the page move operation. The speed of the page move is equal to the speed of moving a bit from a source address to the register bit position in the same column on the chip, shifting the bit to the destination column, and then moving the bit from the register to the destination address on the chip. The only variables are the number of subgroup shifts needed, which can vary from zero to seven in the embodiment of FIG. 3, and the size of the subgroup.

Thus, the source address followed by the destination address, are sequentially provided and accessed on each chip, resulting in a transfer of a page of data in the memory between the source and destination addresses.

SUBGROUP ADDRESSING

Figure 4:
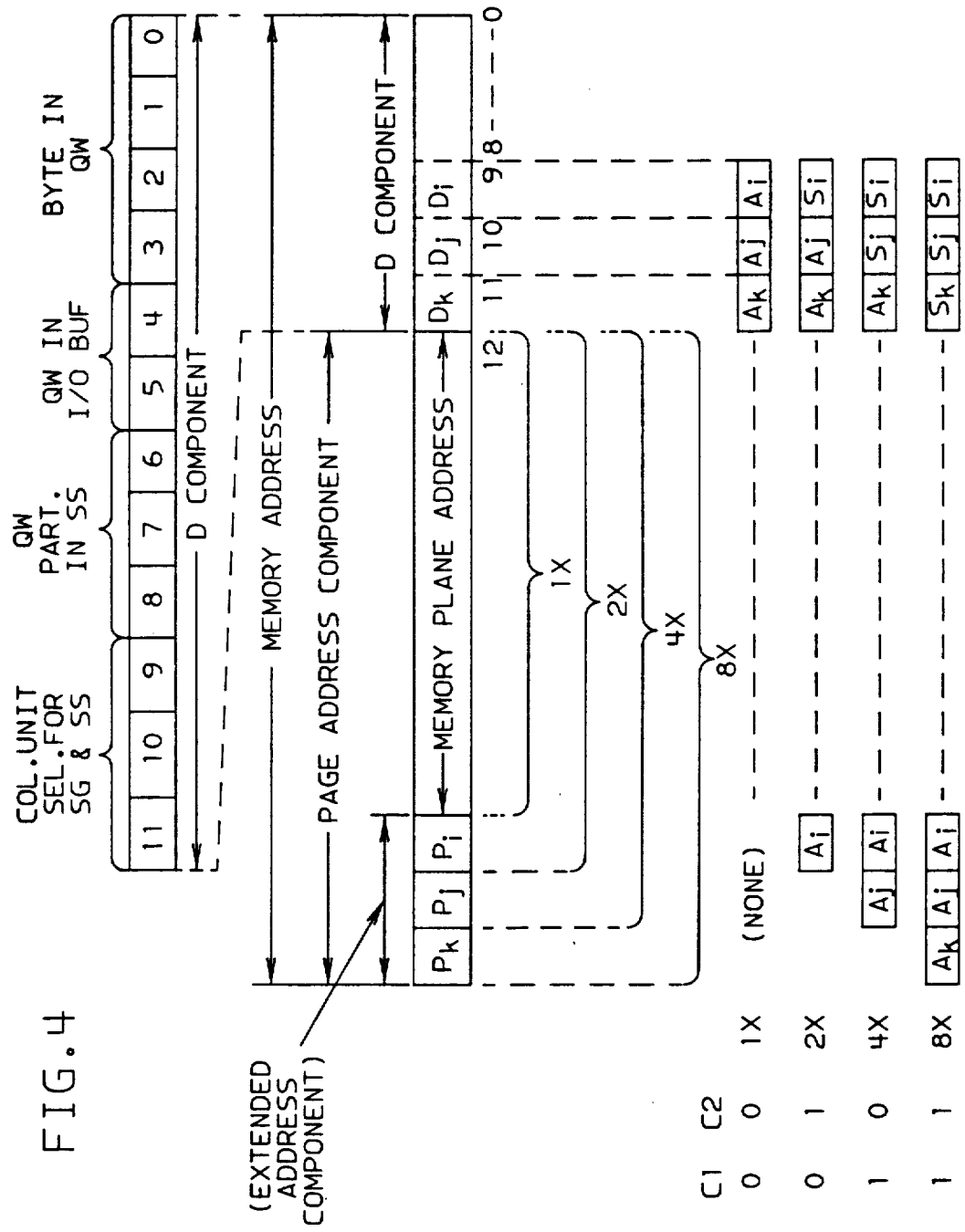
FIG. 4 represents a form of memory address, its components, and address bit assignments used for accessing the memory structure in the preferred embodiment.

FIG. 4 represents a form of memory address which may be used to address any page frame in any memory size from the minimum to 8×. The address form is a physical memory address which includes E number of bits having a page address component and a D address component. The page address component determines the location of any addressed page in the memory. The D component (which is 12 bits) locates a byte of data within a 4 KByte page being addressed by the high-order page address component of the memory address.

The page-address component is considered in two parts: a Memory Plane Address Component representing the minimum memory size, and an Extended Address Component having bit positions Pi, Pj, Pk. The Memory Plane Address Component is provided to the plane address decoder of each chip to address the required plane on the chip. The Memory Plane Address Component selects each required group of 32 bits, i.e. selects the required x,z plane in the memory. Thus with 1 Mbit chips, the address decoder addresses a group of 32 bits on each chip out of the 32,768 groups on the chip.

The Extended Address Component comprised of bits Pk, Pj, Pi is provided by this invention to select one of plural page frames in a plane being addressed by the Memory Plane Address Component. Thus the Pk, Pj, Pi bits select the particular subgroup (SG) of a required page in the addressed x,z plane, when there are plural subgroups in each plane in the memory. The subgroup address effectively divides up the memory into subgroup columns which define the page frames.

All of bits Pk, Pj, Pi are only needed in an 8× size memory (where 8 subgroup columns are needed). None of bits Pk, Pj, Pi are needed in a 1× minimum size memory. Only some of bits Pk, Pj, Pi are needed in a memory between the minimum and 8× sizes. Thus, only bit Pi is used when the memory has a 2× size; bits Pi and Pj are used when the memory has a 4× size. And all of bits Pk, Pj, Pi are used in the largest supported 8× size memory structure. Hence, the effective length of the memory address may vary as a function of the memory size. The relationship between Pk, Pj, Pi and Dk, Dj, Di in FIG. 4 is described later herein.

SHIFT REGISTER

Each chip has a shift register for moving any subgroup bits from one subgroup column to another on the chip. The shift register contains subgroups that align with the respective columns on the chip. Each subgroup in the shift register can communicate with a corresponding number of bits in that column in any plane on the chip. That is, the subgroup of bits for any page in any plane can be copied to a subgroup position in the corresponding subgroup column position of the shift register. When any page subgroup is received in the shift register, the subgroup can be shifted to any other subgroup column position, and there be copied into the subgroup bits for another page in any plane in the memory.

To provide such total subgroup shiftability, the shift register can either: shift bi-directionally, or shift unidirectionally with wrap-around to enable the shifting from any subgroup position to any other subgroup position.

Putting a shift register on a VLSI chip and shifting with wrap-around or bi-directionally is a known art, and is not the invention claimed herein. But integrating such a shift register into a chip design that enables variable memory sizes and memory extendibility without obsoleting existing memory chips is novel to this invention.

The shift register provided on each chip in this invention may have any of many different forms: from a sequential shift register that requires up to 31 shift cycles to move one bit through the register length) to parallel types of shifting circuits, such as disclosed in an article disclosed in the IBM Technical Disclosure Bulletin Volume 19 Number 1 June 1976 pages 207 to 216, entitled "Arithmetic shift" which disclosed a shifter made of parallel combinatorial logic circuits that enable the shifting and registering of a subgroup of bits in a final destination within a single cycle of operation. Between these two extremes are parallel shift registers that can shift by a plurality of bit positions in a single cycle.

PAGE MOVE SUMMARY

Accordingly, each memory chip can be viewed as a large number of N bit subgroups in each M bit group, where the bits in each group contribute to M/N page frames. Accordingly, N is equal to or less than M; and in the described embodiments, M = 32 bits, and N = 4, 8, 16, or 32 bits. An address decoder on each chip receives the minimum memory size address component and selects an addressed one of the groups of M bits. A subgroup decoder receives the Extended Address Component Pi, Pj, Pk and selects an N bit subgroup column in the group currently being selected by the Memory Plane Address component.

In executing a page move command, a source-page (SP) memory address is first-provided, and a destination-page (DP) memory address is last-provided. SP and DP are in the same subgroup column in the memory structure if the Extended Address Component Pi, Pj, Pk is equal in the SP and DP memory addresses. And SP and DP are in different subgroup columns if the Extended Address Component Pi, Pj, Pk is unequal. If SP and DP are in different columns on each chip, a shift register subgroup transfer is needed to change columns for the transferred subgroup, i.e. from the source subgroup column to the destination subgroup column. This is done in the preferred embodiment by controlling the amount of shifting by the shift register of the registered subgroup. The shifting moves the registered subgroup from the source subgroup column to the destination subgroup column on the chip. Thus by controlling the shifting the register subgroup can be moved to any subgroup column position. When any registered subgroup is aligned with a destination subgroup column, the subgroup can then be transferred along the corresponding subgroup column into any plane in the column.

In more detail, a page move from any plane in one subgroup column to any plane in another subgroup column is done by:

1. Applying the SP Memory Plane Address Component to the group address decoder on each chip (to select the plane with the group that will contain a required source subgroup).
2. Applying the SP Extended Address Component Pi, Pj, Pk to the subgroup address decoder on each chip (to address the required SP subgroup in the addressed plane, i.e. source page on all chips, and to address the source-subgroup-column part of the shift register).
3. Copying the addressed subgroup (common to both the addressed plane and the addressed column) into the addressed source-subgroup-column part of the shift register to provide a registered subgroup in the shift register.
4. Applying the DP Memory Plane Address Component to the group address decoder on each chip (to select the plane with the group that will contain the required destination subgroup).
5. Applying the DP Extended Address Component Pi, Pj, Pk to the plane address decoder on each chip (to address the required DP subgroup in the addressed plane, i.e. destination page on all chips, and to address the destination subgroup column in the shift register).
6. Determining if the destination column is equal to the source column, and if they are equal skipping to step 8, but otherwise going to the next step 7.
7. Shifting the shift register until the registered subgroup is in the addressed destination subgroup column.
8. Copying the registered subgroup from the shift register into the addressed destination subgroup on the chip.
9. Performing steps 1-8 in parallel on all chips in the memory to move the addressed source page to the addressed destination page.

The shifting for step 7 can be done by determining the number of shifts for the shift register (S/R).

The limiting cases for step 6 above are: 1. No shifting is required where the source and destination columns are the same (which provides the fastest page move operation since this has no shift time), 2. Maximum shifting is required to reach the destination subgroup column (which provides the slowest page move operation since this has maximum shift time).

Between these two extreme cases, there are the intermediate shifting cases between the two limiting cases. The speed of shifting may be controlled by the design of the shift register.

The maximum number of subgroup columns of shifting built into a memory structure is a function of the maximum supported size of the memory structure to accommodate future size extension, e.g. 2×, 4×, 8×, 16× or 32×. The maximum supported size for the preferred embodiment has been chosen to be 8×. The maximum supported size choice controls the number of bits in a column unit, which is equal to the number of bits in the subgroup of the maximum supported size.

The number of maximum shifting units increases as the size of the memory is increased. Thus as the memory increases by 2×, 4×, 8× the maximum number of shift units required for the register respectively changes, for example in the manner shown in the "Table for SCL" provided later herein.

SHIFT REGISTER CONTROLS

The amount of shifting required by this invention can be controlled by either on-chip or off-chip logic, the latter being used in the preferred embodiment, since only two pins are required on each chip to receive externally-supplied shift pulses. They are: a pin to receive a cluster of shifting pulses, and a pin to receive a Shift Complete signal indicating the end of a cluster of shifting pulses.

Figure 5:
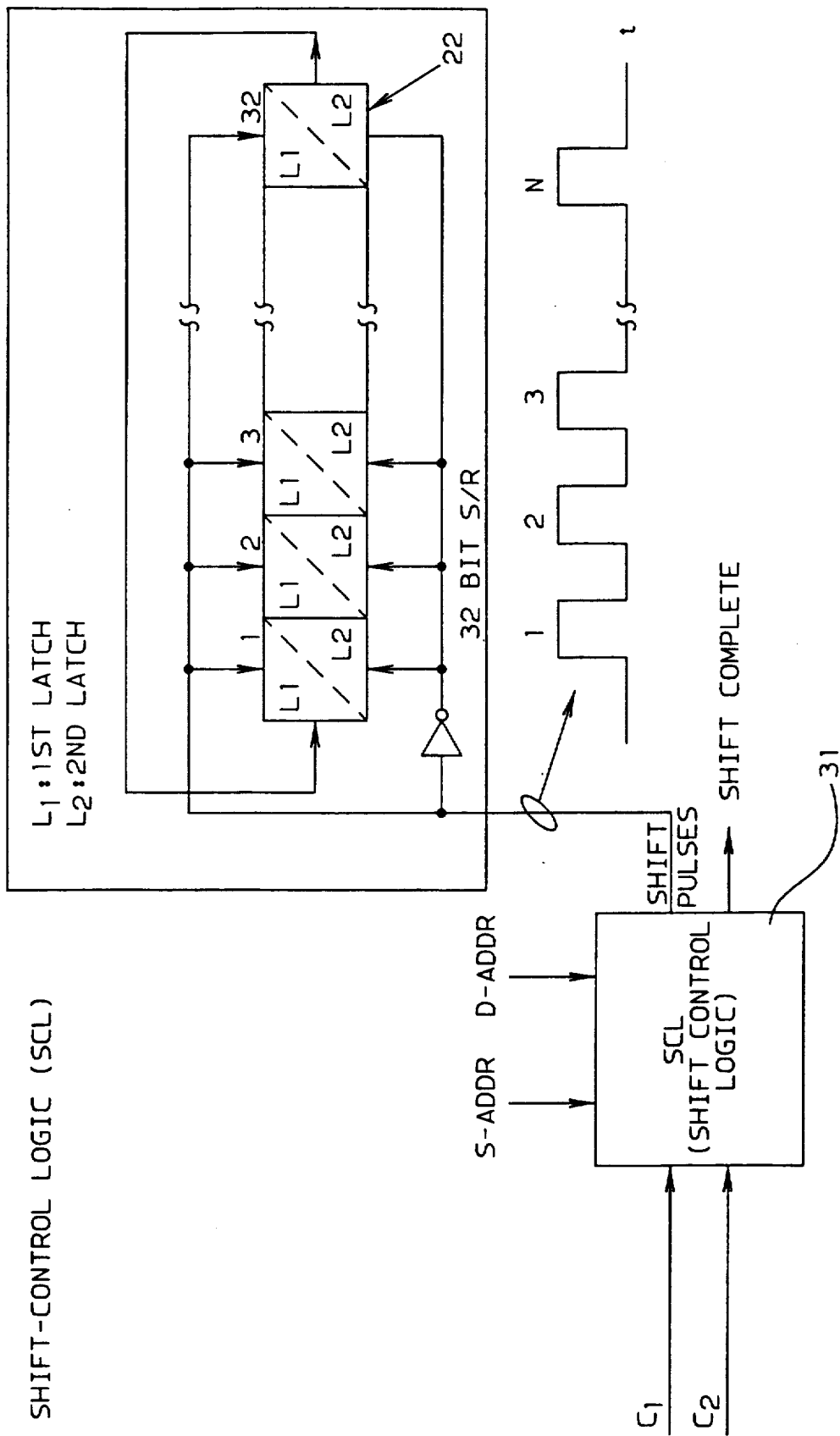
FIG. 5 represents shift control logic used for moving pages of data in the preferred embodiment.

FIG. 5 shows shift-control logic (SCL) 31 provided outside of the memory chips, in which the SCL is a centralized ensemble providing shift pulses and shift complete signals to the shift registers 22 on all the chips comprising the memory structure.

In response to each page-move command, the SCL 31 computes the number of shift pulses required to be provided to the shift register (S/R) 22 to shift the registered subgroup from the source column to the destination column. The computed number of pulses is outputted in a cluster sequence of clock pulses to a shift register pin on each chip in the memory structure to shift all registered subgroups in parallel. The SCL 31 receives the C1, C2 static signals indicating the size of the current memory structure as 1×, 2×, 4× or 8× according to the permutation code of C1, C2. These size signals control the number of shift pulses required for the current memory size.

The logic shown in FIG. 5 need not be changed when the memory structure is extended to any of the sizes indicated by the C1, C2 signals. And the same chip design continues to be used for all chips added to the memory structure to obtain an extension of the memory from the minimum size of 1× to any of the sizes supported by any of the four size values of the C1, C2 signals.

The number of shifting pulses computed for any cluster of provided shift pulses is a function of the following parameters: the group and subgroup sizes, the source subgroup column address (S-ADDR) and the destination subgroup column address (D-ADDR). The group size is fixed at 32 bits for all memory sizes. The subgroup sizes are determined from memory size signals C1 and C2 provided to SCL 31 in FIG. 5, which indicate whether the memory structure is $1\times$, $2\times$, $4\times$ or $8\times$. The subgroup size is determined by 32/(memory size factor). The SCL 31 also provides a Shift Complete signal as soon as each generated cluster of shifting pulses has ended.

The C1, C2 signals are preset to provide a static indication of the memory size. Each page move command provides the S-ADDR and D-ADDR signals on high-order address lines providing bits Pi, Pj, Pk for each of the source and destination addresses. The number of bit positions in the Extended Address Component is determined by the maximum allowable memory size, which may be less than the theoretical maximum memory size. That is, the theoretical maximum size in the described embodiments is $32\times$, which would require five bit positions in the Extended Address component. However, the described embodiment has chosen to provide an actual maximum of $8\times$ (that is less than the theoretical maximum). The described embodiment's actual maximum of $8\times$ is determined by only providing three bits Pi, Pj, Pk in the Extended Address Component.

The shift control function in FIG. 5 automatically supports whichever of the four supported subgroup column widths are required for the selected one of the four sizes of memory structure available. And whichever of the subgroups is selected, it will operate with the 32 bit fixed-size S/R provided on each chip.

AUTOMATIC SUBGROUP SELECT CONTROLS

To enable the automatic operation of a memory structure with any supported size, the groups of bits on the chips are organized into "column units". A column unit is the lowest common denominator among all of the allowable subgroup sizes. The preferred embodiment uses a column unit of four bits to support all of the 32, 16, 8 or 4 bit subgroups usable in the preferred embodiment.

Figure 6:
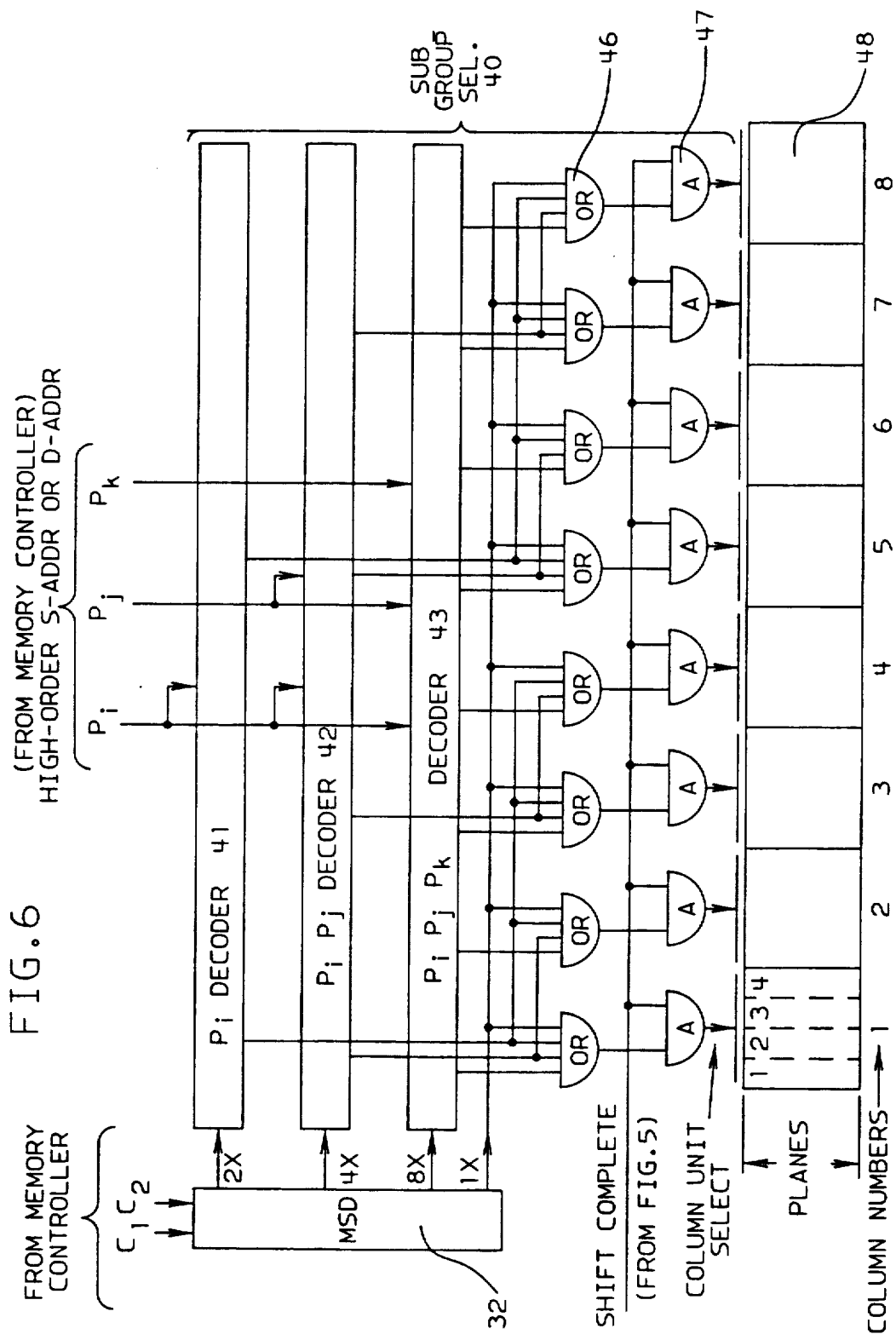
FIG. 6 represents column unit select logic used in the preferred embodiment for adapting a chip to multiple memory sizes.

FIG. 6 shows eight 4 bit column units 48 combined into the 32, 16, 8 or 4 bit column width required for each of the selectable memory extension size factors, $1\times$, $2\times$, $4\times$ or $8\times$, respectively, i.e. 8 column units per subgroup in a $1\times$ memory, 4 units per subgroup in a $2\times$ memory, 2 units per subgroup in a $4\times$ memory, and 1 unit per subgroup in a $8\times$ memory. More than an $8\times$ memory would require that a smaller column unit have been selected than the 4 bit unit shown. For example, if 16 column units per group had been selected (each column unit only 2 bits wide), then a $16\times$ memory maximum size would be supported. And if 32 column units per group had been selected, e.g. each column unit only 1 bit wide, then a $32\times$ memory maximum size would be supported, which is the theoretical maximum size memory structure for a 32 bit group.

FIG. 6 shows a memory size decoder (MSD) 32 connected to the subgroup selector 40. The MSD 32 receives the C1, C2 static signals indicating the size of the memory structure as $1\times$, $2\times$, $4\times$ or $8\times$ according to the permutation code of C1, C2. The $1\times$ signal indicates that the minimum size memory has been installed, and an $8\times$ signal signifies installation of the actual maximum size memory for the preferred embodiment limited by the three bit Extended Address Component (which is smaller than the theoretical maximum size memory, obtainable with a five bit Extended Address Component).

The subgroup columns in the embodiments are selected by combinatorial logic in MSD 32 and the three decoders 41, 42, 43 receiving the six inputs C1, C2, Ai, Aj, Ak and Shift Complete. The Ai, Aj, Ak are three physical pins on each chip to which the signals Pi, Pj, Pk are respectively connected as called for by the memory size.

The decoder circuit 41 supports the $2\times$ memory size and receives only bit Pi, decoder 42 supports memory size $4\times$ and receives bits Pi and Pj, and decoder 43 supports memory size $8\times$ and receives all of bits Pi, Pj and Pk. The active/inactive state of each of the address bits Pk, Pj, Pi is determined by the memory size setting indicated by memory size bits C1, C2. That is, none of or one of the three decoder circuits are statically activated by the decoded outputs of the MSD 32, which receives the current setting of bits C1 C2 indicating the current size of the memory structure. The minimum size memory structure is indicated by a 00 setting of bits C1 C2, and none of the decoder circuits 41, 42 or 43 is activated. The 01 setting of bits C1 C2 activates only the decoder circuit 41. A 10 setting of bits C1 C2 activates decoder circuit 42, and an 11 setting of bits C1 C2 activates decoder circuit 43.

The subgroup select logic 40 shown in FIG. 6 is preferably located internal to the chips in the memory structure in order to reduce the number of chip pins. On the other hand, the combinatorial logic on FIG. 6 may be located external of the memory chips, which will require more pins on the chips for all decoder column unit outputs.

The subgroup select logic 40 includes a group of eight OR circuits 46 and a group of eight AND gates 47. Each connected AND and OR circuit connects to one column unit of 4 adjacent bit positions on the chip.

The $1\times$ output signal of the MSD 32 and the outputs of the three decoder circuits 41, 42 and 43 are connected to the inputs of a plurality of OR-circuits in FIG. 6 to define the respective subgroups required by the supported memory sizes in the preferred embodiment. That is the decoder outputs are combined by the OR circuits into the required subgroups that select subsets of column unit(s) required to provide each currently addressed subgroup (determined by the current page address). In this manner the subgroup column selection automatically occurs at the outputs of the OR-circuits 46. The AND gates 47 time the OR circuit outputs to the column unit pins on each chip upon receiving a shift complete signal from the shift control logic in FIG. 5. The shift complete signal is connected to all of the AND gates 47 to disable their outputs while any shifting is being done by the shift register on the chip.

The output of each AND gate 47 selects one of the eight column units on a chip in the preferred embodiment. One or more AND gates are enabled by output(s) of the OR circuit(s) 46 to automatically select the required column unit(s) for the required subgroup on each chip for the page being addressed.

The number of OR circuits 46 and of AND gates 47 therefore controls the supported maximum size memory obtainable with the used chip organization.

The decoder logic shown in FIG. 6 may be located external to the chips or internally in the chips of the memory. If external, this logic may be provided once for all chips in a memory, and it will be usable when the memory size is extended by merely changing the settings of bits C1 C2, which may be done manually since this setting remains static and is changed only on memory extension. Then the AND gate outputs may be connected to respective pins on each chip. The AND gate signal to each such pin enables a respective column unit on the chip by simultaneously enabling all bits in the column unit.

Hence if the decoder logic 40 shown in FIG. 6 is located internally on the chips of the memory, fewer number of pins will be required on each chip, i.e. six pins, versus 8 pins for external subgroup select logic 40.

In FIG. 6, the eight AND gates 47 support up to eight column units in each 32 bit group. This choice of column unit supports up to a 8× size memory. Accordingly, one or more of OR circuits 46 are activated together by the 1× output signal of MSD 32 and any of the three decoders to enable the column unit(s) required to address one subgroup column. In this manner these ORs are operated by the 1× output signal of MSD 32 and the decoders to automatically control the width and location of the required subgroups on the chips for any page requested in the memory structure indicated by bits C1 C2.

Thus for the 1× memory size, the logic network in FIG. 6 provides a single column having a 32 bit width, which is signalled from the MSD 32 providing a output signal through all of the OR circuits 46 to all of the AND gates 47 to activate all column units in each chip of the memory.

For a 2× memory size, the logic network in FIG. 6 selects among two subgroup columns, each having a 16 bit width. One of these subgroups is signalled by the decoder 41 enabling either the left four OR circuits or the right four OR circuits to select a left subgroup column or a right subgroup column. Either subgroup is formed of a set of four adjacent column units, with either subgroup providing the subgroups required on all chips for an addressed page.

For a 4× memory size, the logic network in FIG. 6 selects among four subgroup columns, each having an 8 bit width. These subgroups are signalled by the decoder 42 enabling one of four pairs of OR circuits 46 to select a subgroup column. Each subgroup is formed of a set of two adjacent OR circuits with the selected one of the 4 subgroups providing the subgroup required in all groups for an addressed page.

For an 8× memory size, the logic network in FIG. 6 selects among eight subgroup columns, each having a 4 bit width. These subgroups are signalled by the decoder 43 enabling one of the OR circuits 46 to select a subgroup column Each subgroup is formed of a set of one column unit, with the selected one of the 8 subgroups providing the subgroup required for an addressed page.

SHIFT CONTROL LOGIC

The active address bits Pi, Pj, Pk and the memory size bits C1 C2 are used by the shift control logic (SCL) 31 to determine the correct number of shift pulses to provide to the shift register on each chip.

Many different shift register configurations are possible for shifting a registered subgroup in the shift register on a chip. For example, a single 32 sequential bit shift register may be used, which will shift by one bit position per inputted shift pulse. Or the preferred shift register configuration in FIG. 7 may be used, which is comprised of four single 8 bit shift registers 51, 52, 53 and 54 that are offset by one bit position from each other. They shift 4 bits in parallel for shifting one column unit (4 bit positions) per inputted shift pulse, and this is 4 times faster than the 32 bit sequential shift register.

Also, the shift register may shift in only one direction with wrap-around. Or the shift register may bi-directionally shift in the shortest direction to the destination subgroup column. Two pins may be put on the chip for receiving the opposite direction shift pulses. A unidirectional shift register may require only one pin on each chip for receiving the shift pulses.

The number of column-unit shifts required is a function of the difference between the active destination address bits Pi(D), Pj(D), Pk(D) and active source address bits Pi(S), Pj(S), Pk(S) for a page transfer. This is shown in a following Table for SCL.

Figure 7:
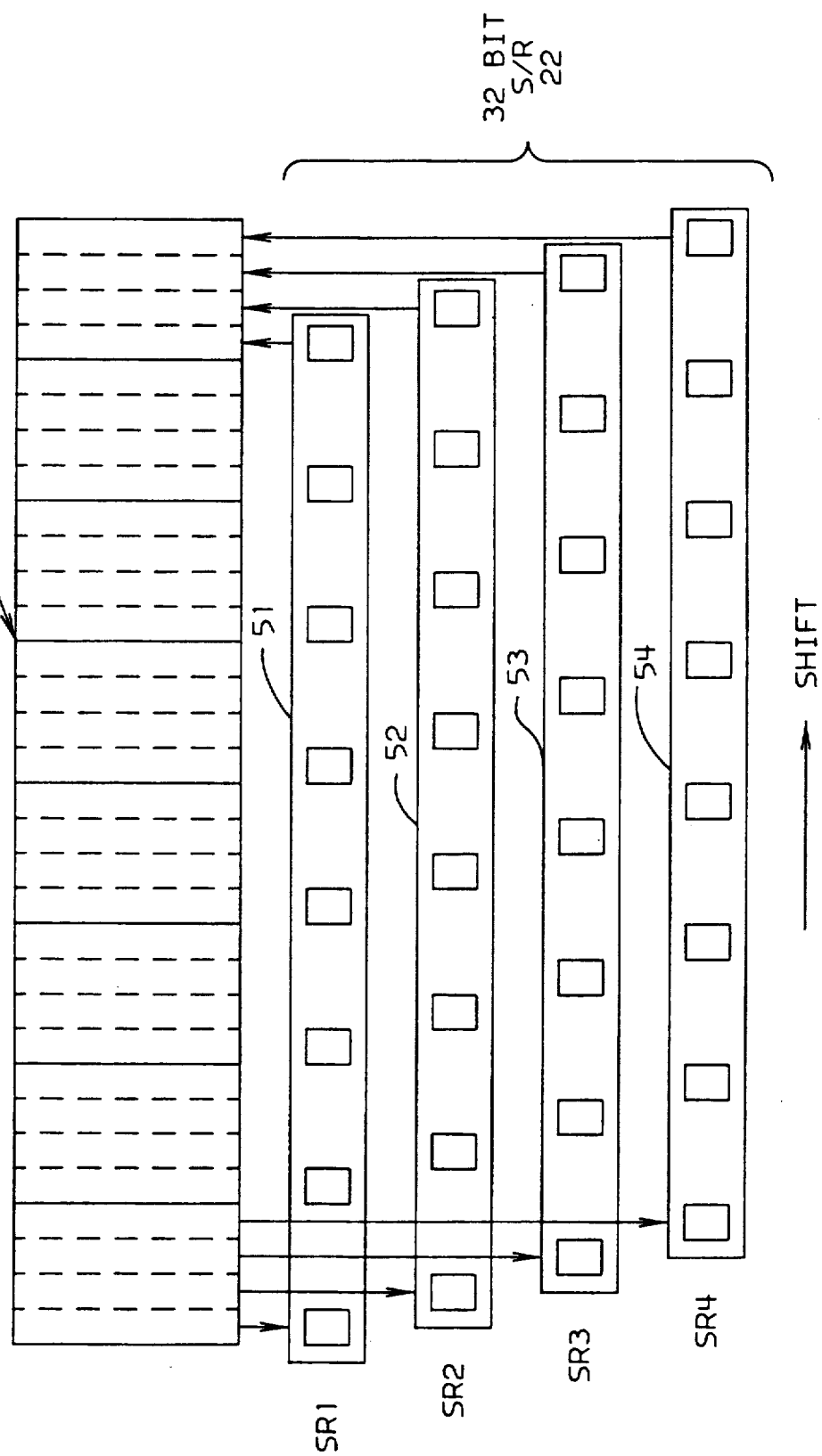
FIG. 7 shows the structure for a shift register used in the preferred embodiment for adapting a chip to multiple memory sizes.
Figure 8:
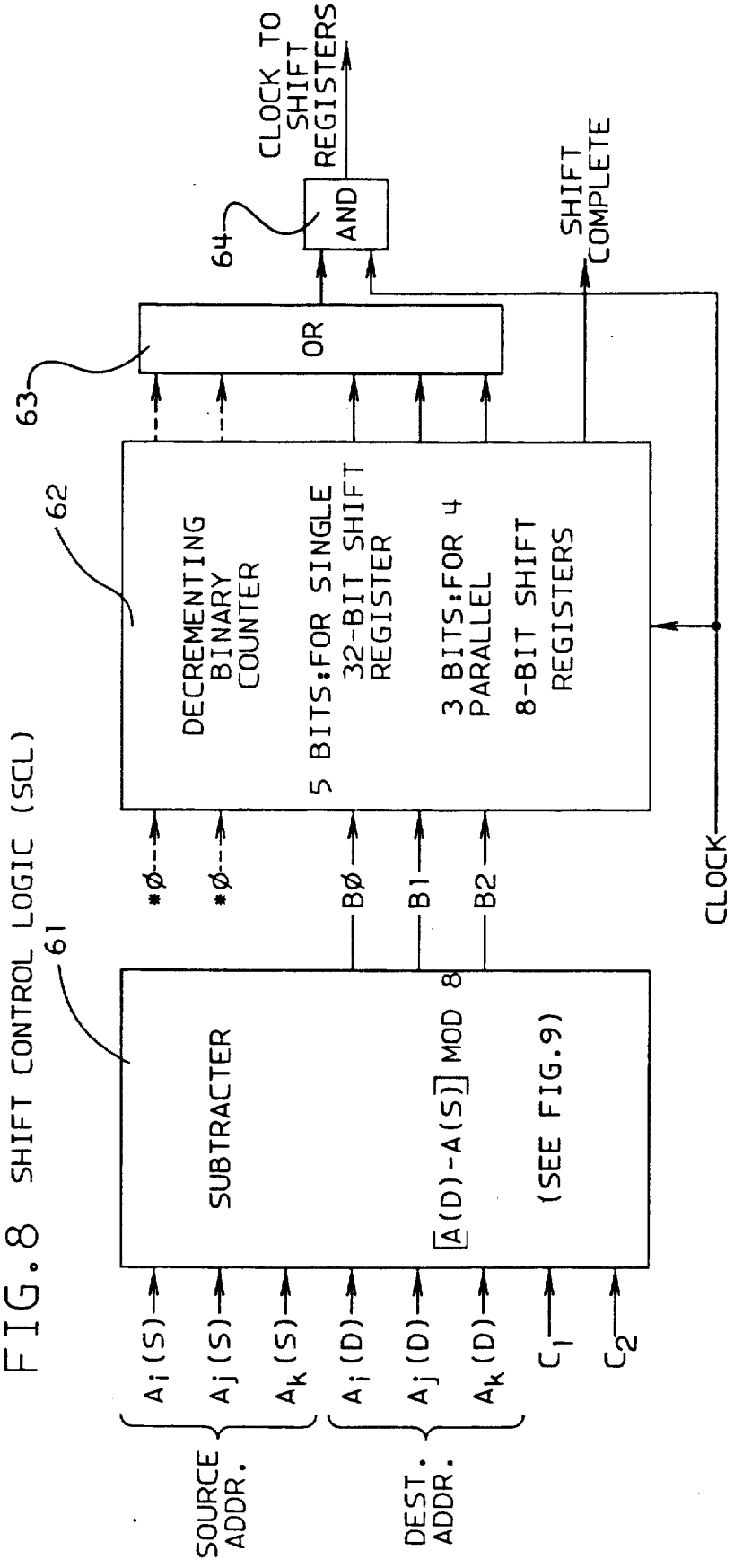
FIG. 8 provides shift pulse controls used in the preferred embodiment.

FIG. 8 shows detailed circuit logic for the Shift Control Logic (SCL) 31, which includes a "Subtracter" circuit 61 that calculates the difference between a source address, S-ADDR, and a destination address, D-ADDR. The subtracter 61 receives at one time the active destination address bits Pi(D), Pj(D), Pk(D), and at another time receives the active source address bits Pi(S), Pj(S), Pk(S) for a page transfer. The Subtracter 61 also receives the C1 C2 memory size bits. The Subtracter produces a three-bit code (B0, B1, B2) which indicates the number of column unit shifts needed for a shift register like that shown in FIG. 7.

The SCL logic circuits shown FIG. 8 may be located external to the memory chips in the memory controller, since the two outputs only require two pins on each chip.

Figure 9:
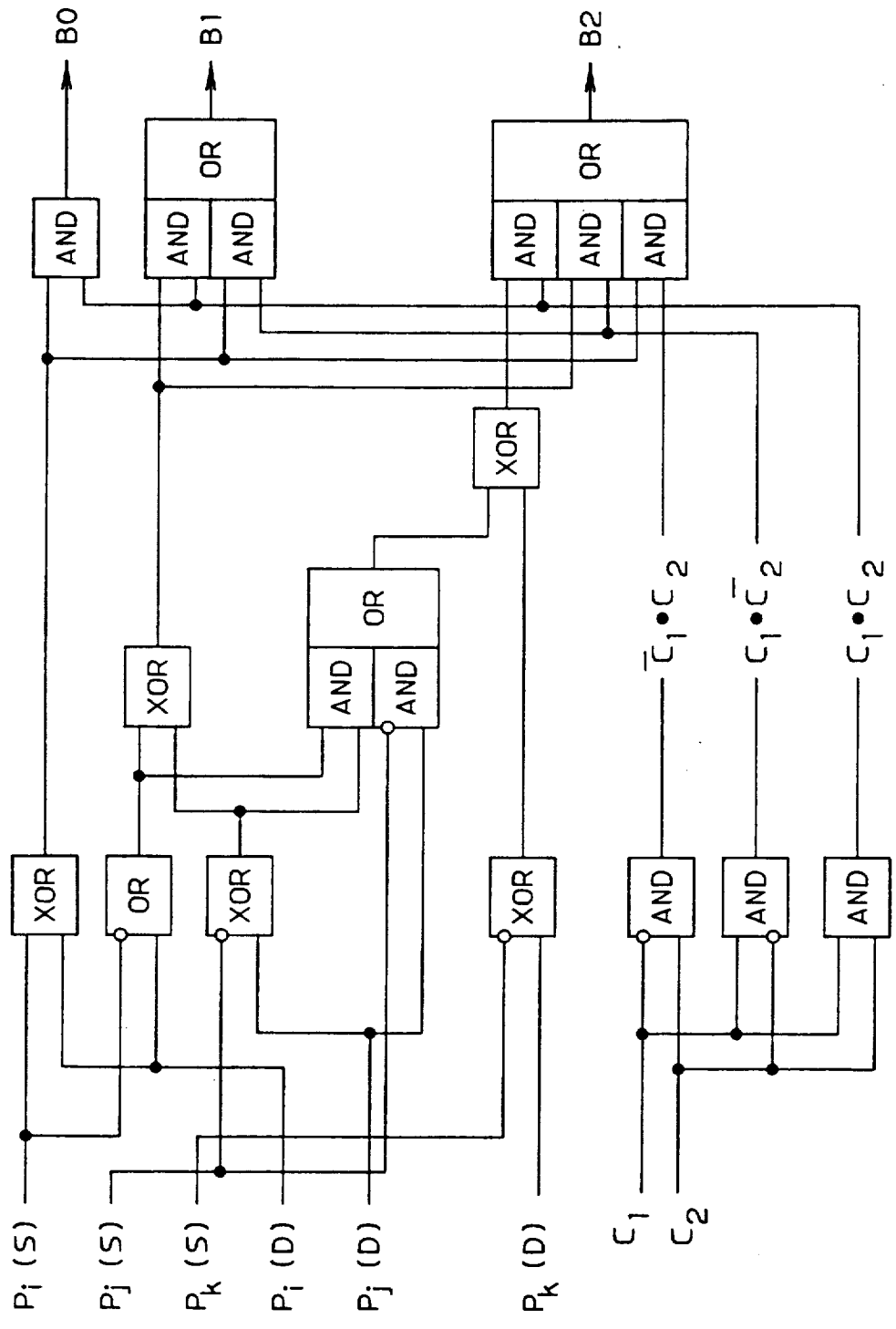
FIG. 9 represents logic circuits found in a subtracter part of the shift pulse controls used in the preferred embodiment.

FIG. 9 shows detailed circuit logic for providing the subtracter 61. A Decrementing Binary Counter 62 (which may be a conventional 3-stage binary counter) has its stages set to the value of the signals B0, B1, B2 provided from the subtracter 61. As soon as the counter 62 is set to the value of the signals B0, B1, B2, the counter 62 will be decremented by clock pulses which are continuously received. The clock pulses decrement the counter from its received three-bit code value down to zero by adding a minus one value to the counter for every clock pulse. The counter 62 stops decrementing when it reaches its zero state, and it will not decrement again until it is set to a non-zero value by subtracter 61.

An OR circuit 63 receives outputs from the respective counter's binary stages, all of which will be in a zero state only when the counter is in a zero state. Therefore while the counter 62 is being decremented, at least one of its stages will output a non-zero state (a one state) to the OR circuit. An AND gate 64 receives and is enabled by a one state passing through the OR circuit 63. Therefore the AND gate 64 is enabled by an output from the OR circuit 63 only while the counter is being decremented.

AND gate 64 also receives the clock pulses, and outputs them as shift pulses. The number of outputted shift pulses will be equal to the value of the initial binary setting B0, B1, B2, which will be a number from 0-7 for a three stage counter. These shift pulses are provided to a shift register on each chip such as shown in FIG. 7.

If a single 32 bit register is used on each chip (rather than the four parallel shift register configuration shown in FIG. 7), two additional bits B (zero state signals) are provided to two additional binary counter stages comprising the Decrementing Binary Counter 62 (at its low order end) to effectively multiply its input value by four. In this case, the Decrementing Binary Counter receives a 5 bit code, and the AND gate outputs 0–31 shift pulses to each S/R.

TABLE for SCL

| MEMORY SIZE = C1, C2 | D-ADDR, S-ADDR RELATIONSHIPS | No. of Unit Shifts to FIG. 7 SHIFT REGISTER |
|---|---|---|
| 1X = 0,0 | Any | 0 |
| 2X = 0,1 | Ai(D)−Ai(S)=0 | 0 |
|  | Ai(D)−Ai(S)=1 or −1 | 4 |
| 4X = 1,0 | Ai(D) Aj(D)−Ai(S) Aj(S)= |  |
|  | 0 | 0 |
|  | 1 | 2 |
|  | 2 | 4 |
|  | 3 | 6 |
|  | −1 | 6 |
|  | −2 | 4 |
|  | −3 | 2 |
| 8X = 1,1 | Ai(D) Aj(D) Ak(D) −Ai(S) Aj(S) Ak(S)= |  |
|  | 0 | 0 |
|  | 1 | 1 |
|  | 2 | 2 |
|  | 3 | 3 |
|  | 4 | 4 |
|  | 5 | 5 |
|  | 6 | 6 |
|  | 7 | 7 |
|  | −1 | 7 |
|  | −2 | 6 |
|  | −3 | 5 |
|  | −4 | 4 |
|  | −5 | 3 |
|  | −6 | 2 |
|  | −7 | 1 |

PAGE MOVE PERFORMANCE

The best case average page transfer time occurs in the minimum 1× size memory, because it does not use any shift transfer time. The shift completion signal can be provided as soon as the source page is stored in the shift register to immediately cause the page to be transferred to its destination address. For example, if the transfer time of a page between the register and either a source or destination address is 50 ns, the total move time for the page between the source and destination addresses will be approximately 2×50 ns=100 ns. Faster operation can be achieved if the copy write operation to the destination takes less time than the copy read operation from the source to the shift register.

The worst case page transfer time may involve a maximum size memory using its maximum shifting time. Assuming the shifting for one column unit requires one machine cycle, shifting 7 columns (FIG. 3) will require 7 shift pulses from the source to the destination column for the longest-time page transfer in an 8× size memory. And if a bi-directional S/R is used, the maximum shifting time is 4 shift pulses. By employing an on-chip parallel switch (not shown), the registered source subgroup may be switched to the destination subgroup column in one cycle without serial shifting. The cost of these various solutions may be additional circuits and potentially larger chip size.

MEMORY INPUT/OUTPUT OPERATIONS

The versatile chip organization includes on each chip accessing circuits for controlling the inputting and outputting of data between the memory and a memory bus. The circuit logic shown in FIG. 10 may be placed on each chip in the memory structure. The input signals to the subgroup selector 40 may be provided from FIG. 14 to three pins on each chip labeled Ai Aj Ak which are transmitted internally on each chip to the circuits requiring these signals, which include the subgroup decoders 41, 42, 43 and the I/O selector 71.

The input/output selector 71 selects one column unit of 4 bits in the shift register (S/R) 22 and transfers the column unit between S/R 22 and a 4 bit input/output (I/O) buffer register 72 in either direction. Buffer 72 registers the I/O data bits between the memory structure and a memory controller (MC) represented in FIG. 11. The MC connects the I/O buffer register 72 to a bi-directional memory bus.

The memory bus comprises a memory data bus 85 and a memory address bus 86, which is connected to one or more processors which process the data accessed in the memory structure. The memory data bus may transfer a parallel data unit, e.g. bytes, data words or data lines, etc. between the memory structure and one or more processors. The processors control the myriad functions which can be done with memory data by processor instructions. For example, the instructions may move data pages within the memory, or move bytes to a different location in the same page frame or to another page frame in the memory, or change the data.

But the memory data bus 85 can not transfer a 4 KByte page parallel-by-bit, because the bus data unit is much smaller than a 4 KB page. The memory bus is limited to a width of bytes, words, QWs or data lines, many of which must be transferred for a single page. The bus requires many memory accesses to transmit a 4 KB page, since a memory bus cannot currently have the 32,768 wires needed to transmit a 4 KByte page parallel-by-bit.

A memory address on the memory address bus 86 in FIG. 11 addresses a byte location within a particular page frame of the one or more page frames that may exist laterally in the addressed plane. Therefore, the only bits of the 32 bits laterally in the addressed plane that can be selected are in the addressed subgroup (i.e. in the addressed page frame). And the other bits in the plane that are not in the selected subgroup can not be selected.

Figure 10:
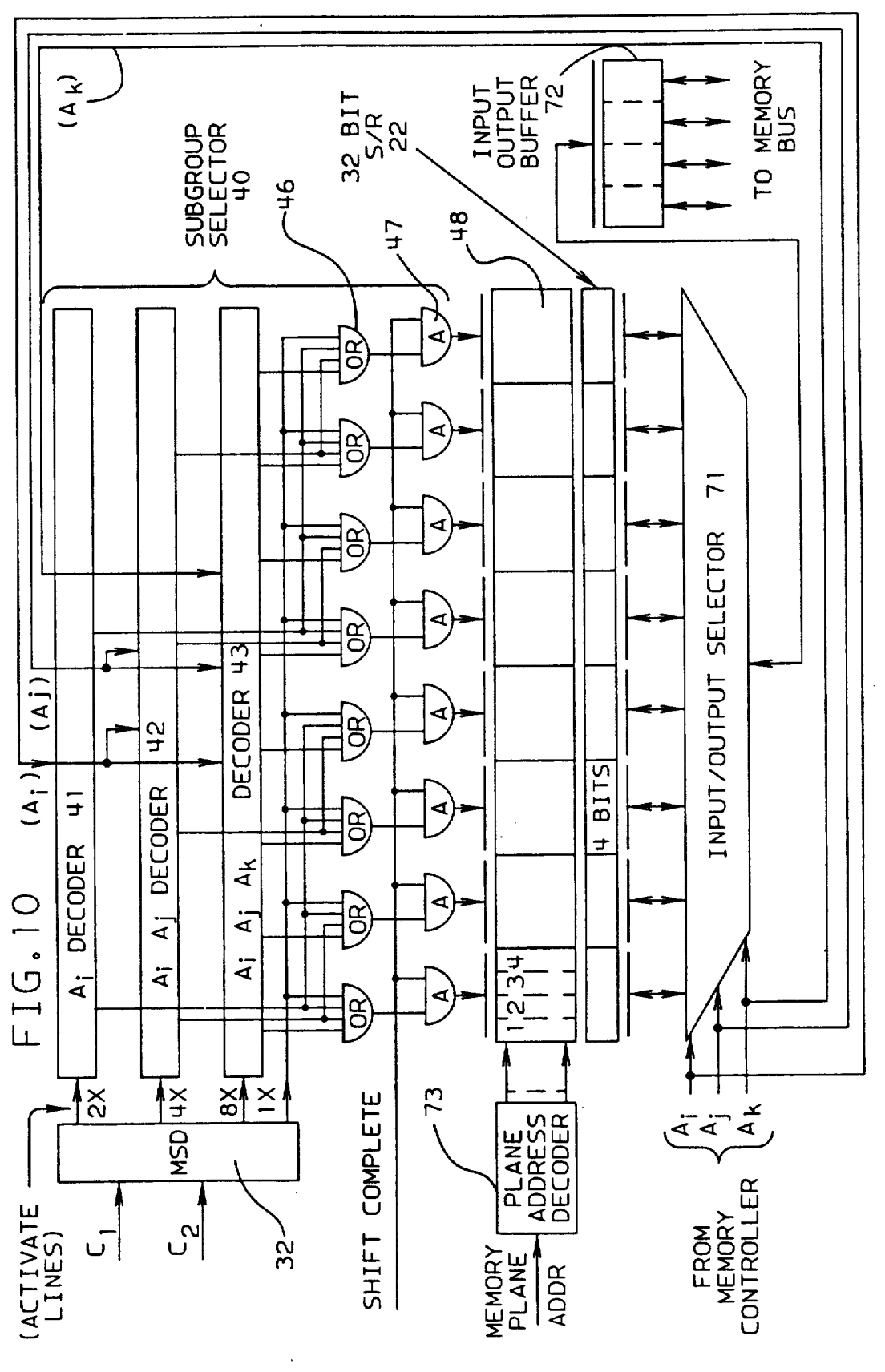

An input/output access of memory data on the chip in FIG. 10 involves selecting a column unit. This involves the selection of a subgroup containing the column unit and copying the subgroup into the S/R 22. This process uses the Memory Plane Address decoder 73 to decode the Memory Plane Address Component, and the subgroup is addressed in the selected plane by using the Subgroup Selector 40 to decode the Extended Address Component of the processor requested address. The memory size bits C1 C2 control MSD 32 to activate one or none of the subgroup decoders 41, 42 or 43. The addressed subgroup is comprised of one or more column units transferred into the shift register 22 on the chip, as has been previously explained herein for page move operations. But no shifting is done by the shift register for an I/O operation, which operates as a static register during an I/O operation. Therefore, the shift pulse generator described herein is not used for externally transferred data units, but is only used in the internal moving of pages within the memory structure.

I/O selector 71 is a decoder of received address bits Ai Aj Ak, which address one of the eight column unit locations in the shift register 22 for selection of the required column unit. I/O selector 71 is only used in the external transfer of data units, and is not used in the internal moving of pages within the memory structure.

Address definition circuits 76 in FIG. 14 provide the SS select bit coded signals Si Sj Sk that are used for selecting one of the storage sections (SSs) in the memory structure. (Each SS has 1024 chips in the described embodiment.) Circuits 76 also provide the bits Ai Aj Ak for subgroup selection in the plane selected by the Plane Address Component in the Page Address Component represented in FIG. 4.

Circuits 76 in FIG. 14 are located in the memory controller (MC) 80 external to the chips comprising the memory structure in the preferred embodiment. Circuits 76 use the memory size signals C1 C2 to derive signals Ai Aj Ak (A bits) and to derive the SS selecting bits Si Sj Sk (S bits) from the Extended Address Component bits Pi Pj Pk (P bits) and from the D Address Component bits D9 D10 D11 (D bits) in the requested address. Thus, the A bits and S bits are selected from the P bits and D bits under control of the memory size C bits. The number of S bits varies between none and three which are selected from bits D9 D10 D11.

The A bit selection process applies each selectable and active P bit (activated by the C bits) to fill the correspondingly labeled A bit position. No P bit is selectable when the C bits are both zero (for the 1× size). Any unfilled A bit position(s) is filled with the highest-order unused D bit(s). The S bit selection process selects as S bits the remaining D bits which are not selected to fill an A bit position.

Alternatively to FIG. 14, the selection of signals Pi Pj Pk and Di Dj Dk into Ai Aj Ak and into Si Sj Sk can be done by manual switches, or by direct wiring of the selected bit signals to the pins Ai Aj Ak on each chip at the same time the memory size is changed.

The I/O selector 71 uses all three of the received signals Ai Aj Ak for selecting one of the eight column units in the shift register 22. On the other hand, the subgroup selector 40 in FIG. 10 automatically limits its use of the received signals Ai Aj Ak only to the A bit(s) corresponding to a selectable and active P bit(s), as is indicated in FIG. 4.

The SSs are partitioned in the memory structure, and all chips in a partition are activated in parallel by the Ai Aj Ak signals to cause simultaneous registering of the 4 bits in the same column unit on every chip in the I/O buffers 72 of an addressed partition of chips.

Many choices are available on how the I/O buffers 72 are to be connected to the memory bus. For example, the bits in the I/O buffers 72 may be transferred as single bytes, or as a 32 bit word, or a double word (DW) or a quadruple word (QW) or a line of data having many QWs, etc.

How the bits in the I/O registers 72 are mapped into data units also can be done in several different ways. A system reliability constraint used in many prior systems maps only one bit per chip into a data unit and adds parity check or error correcting bits to each data unit, so that failure of a chip will cause failure of only one bit in any data unit which can then be detected and corrected. When a data unit is referenced herein, such additional supporting bits are implied as being optionally included. Accordingly, when using the one bit per chip per data unit constraint, the memory structure requires an extra chip for each supporting bit (e.g. parity bit or error correcting bit) added to a data unit for reliability support. Such added chips for parity and/or error correction support increase the numbers of chips given in the examples of data units discussed in this specification, but such added chips do not change the principles of this invention discussed herein.

Accordingly, the preferred embodiment distributes the bits in each data unit in the memory structure to provide one bit per chip per data unit. For example, 128 chips are needed for the data bits in a QW (plus a chip added for each support bit with the QW). Hence, each of the four bits in I/O buffer 72 is in a different data unit. And, four QWs are registered in the I/O buffers 72 of each of 128 adjacent chips (plus support chips) comprising a QW partition. The set of four QWs in buffers 72 may be any of the QW sets shown in FIG. 11 for respective QW partitions.

DATA UNIT ADDRESSING IN THE MEMORY STRUCTURE

Another memory constraint adapted for the preferred embodiment is to have contiguous memory addresses for the 4 QWs simultaneously buffered in the I/O buffers 72 and in the QW data buffers 84 for each QW partition shown in FIG. 13. This constraint is accommodated by the choice of address bit assignments to the memory structure.

FIG. 12 shows a mapping of QW sets 0–63 in the 8 QW partitions in each plane 81 of a storage section (SS) in the memory structure. In FIG. 11, each SS has 1024 data chips (plus support chips). The 1×, 2×, 4× and 8× size memory structures have 1, 2, 4 and 8 SSs, respectively.

Accordingly in FIG. 12, each SS is divided in the z dimension into 8 "QW partitions", each partition including 128 chips. Each QW partition contains eight QW sets in each plane, e.g. partition 0 contains QW sets 0–7. Therefore, each QW partition has 32 QWs in each plane. Thus, eight QW partitions 0–7 in each plane are in the 1× structure. An 8× structure has 64 QW partitions in each plane.

One QW set (4 QWs) may be registered in the I/O buffer 72 of the QW partition and immediately transferred to a QW data buffer 84 in FIG. 13 For example, QW0–QW3 in any addressed plane within partition 0 of the SS may be buffered in partition 0 of its QW buffer 84 of that SS. Thus each SS may simultaneously buffer 8 different QW sets in its QW buffers 84 for the eight respective QW partitions in the SS.

The different QW sets in buffers 84 may be accessed independently in the different partitions using the QW selector 82 shown in FIG. 13. Selector 82 can receive and register different memory addresses for the different QW partitions, so that the different QW partitions may operate independently of each other to respectively be accessing different QW sets. This is easily done in the memory structure of the invention, where the memory address bus can send 8 or more new addresses in the time it takes any QW partition to access a QW set and transfer it into its QW buffer 84. This allows a different plane with a different subgroup to be simultaneously and independently addressed and accessed in the different QW partitions, instead of addressing and accessing the same plane throughout the entire memory structure as is required during an internal page move operation.

Hence, the independent addressing of QW partitions allows either simultaneous or independent accessing of different QW sets in the different QW partitions of the memory structure. Then, interleaving of the accessing of different QW sets and their QWs in the different QW partitions may easily be done.

The storage section (SS) selection in a memory structure greater than 1× is controlled by signals Si Sj Sk in the MC 80 shown in FIG. 11. The S bit signals are obtained from FIG. 14. The three S bits enable selection of an SS in up to an 8× size memory containing 8 SSs. QW selector switch 82 shown in FIG. 13 controls the selection of the QWs in the QW buffers 84 of the respective QW partitions of the SSs. Thus, the QW selector switch 82 may be designed: for simultaneous selection of all buffered QW sets, or for interleaved QW set selection, or for selecting only one QW at a time of the buffered QW sets ready for transfer in the memory structure. QW select decoder 83 uses bits D4 D5 with selector switch 82 to select an addressed QW in the QW buffer 84 of an addressed partition. For example, a single QW may be selected for a transfer into buffer 84 from the memory bus for a memory write operation into a fetched QW set. But a memory read operation may simultaneously access all QWs in buffer 84 for a single transfer to data bus 85 if the memory data bus has the width to accommodate all of its QWs.

The processor addresses of the QWs in the memory structure are mapped so that the 8 QW sets in the QW buffers 84 of a section have consecutive memory addresses. The QWs may be transferred in parallel, or sequentially, to or from any processor by the QW selector switch 82 in FIG. 13. The preferred embodiment reads from memory all 32 buffered QWs at a time using switch 82, but writes into memory a single QW at a time in a fetched QW set.

The QW selection is done by means of the signals from bit positions D4 through D11 in the D Address Component in the currently requesting address. The memory size bits C1 and C2 control how address bits D9–D11 select the SS containing the addressed QW, and select the column unit (page frame) having the addressed QW set in the selected QW partition. Address bits D6–D8 select the particular QW partition having the required buffered QW set in the selected SS for transfer. Bits D4 D5 select the addressed QW in the selected QW set in the QW buffer 84 of the selected QW partition.

FIG. 4 includes an exploded view of the bit assignments in the D Address Component to obtain sequential memory addresses for the 4 bits in the I/O buffer 72 of any chip of the preferred embodiment. The D address Component locates a particular byte in any page frame in the memory structure by causing the QW set with the required byte address to be accessed into QW buffers 84 of its selected QW partition. Bits D6 D7 D8 cause switch 82 to select the addressed QW partition in the selected SS. QW selector 83 in FIG. 13 receives the D component bits D4 D5 of the requesting address to select the required one of the 4 QWs in any partition of the QW data buffers 84. Address bits D0 D1 D2 D3 distinguish which of the 16 bytes in the selected QW is being addressed.

The following examples assist an understanding of the addressing in the different size memory structures, during which reference may be made to FIGS. 4, 10 and 11:

With a 1× size memory (which has only one SS comprising 1024 chips), bits D6–D8 select one of 8 QW partitions in the SS. Size bits C1 C2 cause all 8 column units in the addressed plane on the chip to be copied into each S/R 22 in the selected QW partition. (In the 1× memory, the 32 bit group of 8 column units is also the 32 bit subgroup.) Also bits C1 C2 direct D9 D10 D11 to become bits Ai, Aj, Ak which cause the I/O selector 71 on each chip in the partition to select one of the 8 column units registered in the S/Rs 22 as the selected QW set. The selected QW set in the S/Rs 22 is transferred to the I/O buffers 72 on each chip and into the QW buffer 84 for the partition. Bits D4 D5 select an addressed QW in the QW set in a QW buffer 84 using decoder 83. The selected QW is transmitted from the memory data bus by the QW selector switch 82.

With a 2× size memory, bits C1 C2 direct bit Pi to be bit Ai, direct bits D10 D11 to be bits Aj Ak, and direct bit D9 to be bit Si for selecting one out of the two SSs in the 2048 chip memory structure. Then D6–D8 select one of the 8 QW partitions in the selected SS. Bit Ai applied to decoder 41 selects one of the two subgroups (i.e. for the selected page frame), and the selected subgroup is copied into S/Rs 22 in the chips of the QW partition. (Bit D9 is not used in the 2× memory for subgroup definition.) I/O selector 71 then uses bits Ai Aj Ak to select the required column unit in the S/Rs 22 to select the QW set which is then transferred from the S/R 22 to the partition's I/O buffers 72 and into the QW buffer 84 for the partition, in which D4 D5 can select one of the 4 buffered QWs in the I/O buffer 72 using decoder 83.

With a 4× size memory, bits C1 C2 direct bits Pi Pj to become Ai Aj, and direct bit D11 to become Ak. Also, bits C1 C2 direct bits D9 D10 to become bits Si Sj, which select one of the four SSs in the 4096 chips. Then bits D6 D7 D8 select one of the 8 QW partitions in the selected SS. Bits Ai Aj operate decoder 42 to select a subgroup on each chip of the partition, which is transferred into the S/Rs 22. (Bits D9 D10 are not used in the 4× memory for subgroup definition.) Bits Ai Aj Ak then select the addressed column unit in the S/Rs 22, which are transferred to the I/O buffers 72 on the chips of the selected QW partition in the selected SS. AND D4 D5 operate through QW decoder 83 to select the addressed QW in the I/O buffer 72 and into the QW buffer 84 for the partition. AND QW selector switch 82 can input the QW to the memory data bus 85.

With an 8× size memory, bits C1 C2 direct Pi Pj Pk to become Ai Aj Ak as shown in FIG. 4. Also, bits C1 C2 direct bits D9 D10 D11 to become Si Sj Sk for selecting one of the 8 SSs. None of bits D9 D10 D11 are used in the 8× memory for subgroup definition. Then bits D6 D7 D8 select one of the 8 QW partitions in the selected SS. Bits Ai Aj Ak further operate decoder 43 to select a subgroup of 4 bits (which is also the column unit required for the I/O buffers 72), and it is registered in S/R 22. (None of bits D9 D10 D11 are used in the 8× memory for subgroup definition.) Bits Ai Aj Ak also operate the I/O selector 71 to transfer the selected QW set to I/O buffer 72. AND bits D4 D5 select one of the buffered QWs in I/O buffer 72 and into the QW buffer 84 for the partition. Switch 82 can input the QW from the memory bus.

MEMORY CONTROLLER

In FIG. 11, the memory controller (MC) is required to interpret the form of each address received from a processor (of which there may be more than one in the system) and provide the address components required by the different decoders and the different chip sections and partitions in the memory structure. For example, the MC differently distributes the address components of a processor requested address for a processor page move instruction than for a processor instruction requiring one or more data units on the memory bus to the processor. For a page move instruction, all sections and partitions of the memory structure receive the same memory address components. But for an instruction requiring the memory bus, only the partition(s) accessing the requested data unit(s) may be enabled by its (their) requesting memory address(es). The different types of address component distributions are controlled by the MC to the plane address decoder 73 and the subgroup selectors 40 on the chips. SS decoder circuits (not shown) in the MC receive the SS bit coded signals Si Sj Sk and decode them to select one of eight SSs.

The MC controls the accessing of processor requested data, including the accessing of a page of data simultaneously on all chips in the memory structure for an internal page move, or the accessing of a data unit for the memory bus involving the selection of one storage section (SS) and one QW partition having only a small part of the chips in the memory structure. In FIG. 11, each SS has 1024 chips, in which there are eight QW partitions (represented in FIG. 12), each having 128 chips (plus support chips) selected for transferring to or from the I/O buffer 72 one QW set of data units available to the memory bus. All QW sets in buffer 84 may be transmitted on the memory bus to the processor if the memory data bus 85 is wide enough to handle all of these QWs in parallel.

LOGICAL L3/L4 ADDRESSING SEPARATION

The memory controller (MC) shown in FIG. 11 generates all of the described control signals and transfers the QW data words accessed in the memory structure of this embodiment.

Another function which may be done by the MC is to control the allocation of page frame addresses in the memory structure between different logical memories, such as a main storage memory (that is called L3) and a random access backup expanded storage (that is called L4). This logical combination of L3 and L4 in the same memory structure has the great advantage of providing exceedingly fast page transfers between the logical memories without using any external transfer bus. The speed of page transfers between these logical memories is obtained by the ability of this memory structure to transfer an entire page of data (i.e. 4096 bytes) parallel-by-bit within, for example, two storage cycles with one copy-read and one copy-write operation, which cannot be done in any known memory system.

For example, the addressability in the memory structure which corresponds to the absolute addressability requestable by the processor(s) in the system can be used as "L3 main memory" addresses. Any page-frame addressability in the memory structure beyond the processor absolute addressability can be reserved for an "L4 expanded memory", which can be addressed on a page basis using the page address component shown in FIG. 4. And any page frames in the memory structure within the processor absolute addressability, but not desired for use by the processor(s), also can be reserved as page frames for the "L4 expanded memory".

Thus a "boundary" page frame address for the memory structure may be specified to the MC and used by the MC to distinguish page frame address assignments between the L3 and L4 logical memories. The L3 page frames would correspond to receivable absolute addresses provided in response to processor instruction storage operands, and the L4 page frames would correspond to the special page addresses such as in operands of Page-In and Page-Out instructions.

An alternative logical L3/L4 example may use a designator signal provided by the requesting processor to distinguish each requested address as either an L3 main storage address or an L4 backing page store address. Then, each page frame stored in the memory structure may have an indicator bit stored therewith for indicating its type, for use when read from the memory structure.

A further alternative is to use no designator or address boundary to indicate a distinction between types of page frames between the logical L3/L4 memories by having the processor(s) and its programming be solely responsible for recognition of the L3/L4 page frame distinction.

The processor responsibility technique, and the designator signal technique, allow the L3/L4 page frames to be scattered in the memory structure.

It must be pointed out that the following parameters are given herein as the preferred embodiment, but the invention allows other choices than: the 32 bit width of the planes and S/Rs, the 4 bit size of I/O buffer 72, the assignment of the D Component bits D9 D10 D11 for use in the select operations included in bits Ai Aj Ak and Si Sj Sk, the use of three bit values for the A bit values and the S bit values. And the bit positions D0 through D8 can have other assignments in the various memory sizes. Some choices of D bit assignments may result in having more than one bit per chip per data unit (e.g. per byte, word, DW, QW or data line, etc.).

Although this invention has been shown and described with respect to plural embodiments thereof, it should be understood by those skilled in the art that various changes and omissions in the form and details of the invention may be made therein without departing from the spirit and the scope of the invention.

Having thus described our invention, what we claim as new, and desire to secure by Letter Patent is:

1. A memory structure made of semiconductor chips containing a large number of locations for containing data pages, comprising each chip containing an array of M bit groups, each M bit group having M/N number of N bit subgroups, each chip further comprising:
    selection means for selecting an N bit subgroup within an M bit group, each subgroup being part of a page frame, and the value selected for N controlling the number of pages in (and the size of) the memory structure;
    means for positioning a subgroup within a chip to any of M/N subgroup positions within any group,
    transfer control means for controlling the positioning means and the selection means to select any of the subgroups as a source subgroup in a source page frame and to select any other of the subgroups in the chip as a destination subgroup in a destination page frame, transferring the source subgroup to the positioning means, positioning the source subgroup to one of the M/N positions in alignment with the destination subgroup, and transferring the source subgroup to the destination subgroup on the same chip, and
  means for a memory controller (controlled by a processor requesting a page transfer) to control the transfer control means in all chips of any of several different size memory structures for enabling the selection means and the registering means to copy a page from a selected source page frame to a selected destination page frame, a page transfer being done entirely by the transfer of the source subgroup to the destination subgroup internally within each of the chips without any page data bit passing through any connector pin on any chip to any bus external to the chip during the page transfer.

2. A memory structure of changeable size as defined in claim 1, each of the chips further comprising:
shift control means for controlling movement of a subgroup in the positioning means to align bits in the subgroup with the destination page frame in the memory structure.

3. A memory structure of changeable size as defined in claim 2, the chip further comprising:
plane decoder means for decoding a plane address component of a requested memory address to locate a required group on the chip,
subgroup decoder means for decoding an extended address component having a higher order in the requested memory address than the plane address component, the subgroup decoder means selecting a subgroup in the group located by the plane decoder means, the subgroup representing the addressed page on the chip.

4. A memory structure of changeable size as defined in claim 3, the chip further comprising:
memory size means for providing memory size signals for indicating the current size of the memory structure,
means for controlling the number M/N of subgroups in each group to different power of two when memory size means signals each size for the memory structure.

5. A memory structure of changeable size as defined in claim 4, the subgroup decoder means further comprising:
a plurality of subgroup decoders for respectively supporting multiple memory sizes,
means for enabling one of the subgroup decoders with a memory size signal from the memory size means to enable a current M/N width for all subgroups in the groups on the chip for the current memory size.

6. A memory structure of changeable size as defined in claim 5, the subgroup decoder means further comprising:
column unit gating means for defining a column unit width having the M/N width of a largest supported memory size,
means for gating the selection of each subgroup in any selected group as a set of one or more column units, each subgroup having a width equal to one or more column units in the different supported memory sizes.

7. A memory structure of changeable size as defined in claim 6, the subgroup decoder means further comprising:
a processor generating memory addresses requested of the memory structure,
memory controller means for receiving each processor requested memory address and generating therefrom a plane address component and any extended address component and respectively providing them to the plane decoder means and to the subgroup decoder means.

8. A memory structure of changeable size as defined in claim 7, the subgroup decoder means further comprising:
a processor move page instruction providing a source page address and a destination page address for respectively locating a source page frame from which a data page is read and for locating a destination page frame in which the data page is to be written, and
the memory controller means respectively receiving the source page address and the destination page address for providing source components of the memory address to the memory structure for locating a source page frame having the data page and then for locating a destination page frame for receiving the data page.

9. A memory structure of changeable size as defined in claim 8, the memory controller means further comprising:
address control means for providing the source page address components to the plane address decoder means for accessing the source page, and
the subgroup decoder means decoding any extended address component from the memory controller if the memory size means is indicating the memory structure is greater than a minimum size for the memory structure.

10. A memory structure of changeable size as defined in claim 9, the shift control means further comprising:
shift determining means for determining the amount of any shift movement needed for positioning an N bit subgroup in the positioning means for positioning the subgroup to a position for a selected destination page frame.

11. A memory structure of changeable size as defined in claim 10, the shift control means further comprising:
means for completing any required shifting of the subgroup for positioning the source subgroup in the positioning means before transferring the source subgroup to a selected subgroup in a destination page frame.

12. A memory structure of changeable size as defined in claim 11, the shift determining means further comprising:
a shift pulse generator for determining the number of shift pulses provided by the control means for each page move request by a processor, the shift pulse generator comprising: subtracter means for subtracting any extended address component of a source page frame address from any extended address component of a destination page frame address to determine the number of shift pulses to be generated for obtaining the amount of shift movement required for the subgroup, the shift movement being done only for memory sizes greater than a minimum size memory structure.

13. A memory structure of changeable size as defined in claim 12, the shift determining means further comprising:
a decrementing counter being set to the number of shift pulses determined by the subtracter means to be provided, and pulsing means for decrementing the counter to its zero setting, and
gating means enabled by the counter while the counter has a non-zero setting, the gating means passing a required number of pulses from the pulsing means as shift pulses to a shift register on each chip while the gating means is enabled by the counter.

14. A memory structure of changeable size as defined in claim 7, further comprising:
input/output I/O) addressing means in the memory controlling for providing a requesting memory address with a column unit selector code for accessing each column unit of a subgroup on the chip, the column unit being a number of bits integrally divisible into a subgroup,
a subgroup on each chip having one or more column units as determined by the size of the memory structure,
means for copying the subgroup on each chip into a corresponding number of column units in the positioning means,
input/output (I/O) selector means on each chip for selecting a column unit of the subcolumn in the positioning means for a page transfer operation in the memory structure.

15. A memory structure of changeable size as defined in claim 14, the input/output I/O selection means on each chip further comprising:
column unit selection means for locating a column unit in the positioning means, including:
means for generating a column unit selector code, in which the selector code contains a predetermined number of bits equal to the number of bits in an extended address component of a memory address for a maximum size memory structure being supported,
means for including in the column unit selector code all bits in any extended address component of the current memory address, and when the selector code still has less than the selector code's predetermined number of bits: also including in the selector code one or more bits taken from predetermined bit positions in an internal page address component in the current memory address until the total number of bits in the selector code is equal to the predetermined number.

16. A memory structure of changeable size as defined in claim 15, the input/output selector means further comprising:
an I/O register for containing a buffered column unit of data obtained from, or to be transferred to, a column unit in the positioning means selected by the column unit selector code.

17. A memory structure of changeable size as defined in claim 1, further comprising:
an input/output (I/O) addressing means in a memory controller,
I/O data unit addressing means for providing a requested memory address for a data unit of plural bits internal to a data page for accessing a group of the chips in the memory structure that contain the requested data unit, the requested memory address addressing a page frame in the memory structure internally containing the data unit within a page at a requested memory address, and
data unit control means for selecting I/O registers on a selected subset of chips comprising a data unit partition in the memory structure having the required I/O data unit, the data unit being transferred outside of the memory.

18. A memory structure of changeable size as defined in claim 17, further comprising:
the data unit control means selecting the data unit as a byte, word, double word, quad-word or set of quad-words from the subset of chips selected by the I/O data unit addressing means.

19. A memory structure of changeable size as defined in claim 7, the selection means further comprising:
a plurality of selectable columns, each column having an integral number of column units in each M bit group in the array, each column unit having the same number of bits in all groups in the array, the number of bits in each column unit being equal to the number of bits in a subgroup for a maximum size memory.

20. A memory structure of changeable size as defined in claim 7, further comprising:
a memory controller for generating memory addresses for the memory structure from received processor addresses,
means for dividing page frame addresses within the memory structure into two separate locations, including,
main memory page frames being provided at one set of locations, and
backup paging store page frames being provided at another set of locations in the memory structure.

21. A memory structure of changeable size as defined in claim 20, further comprising:
the processor providing addresses to the memory controller designated for either a main memory page frame or a backup paging store page frame.

22. A memory structure of changeable size for moving any data page from a source page frame address to a destination page frame address, the memory structure comprising:
a multiplicity of chips having the same design, each chip including:
an array divided into a plurality of addressable M bit groups, and a shifting means for registering data,
selection means for addressing an N bit subgroup location in an M bit group in the array on each chip, each N bit subgroup containing all of the bits on each chip of a page frame in the memory structure, the N number of bits in a subgroup (and the number of subgroups in each group) varying with the size of the memory structure,
accessing means for transferring an N bit subgroup addressed by the selection means into a subgroup position in the shifting means,
the shifting means capable of shifting a received data subgroup to any subgroup position in the shifting means,
control means for determining the amount of shifting required by the shifting means to move a received source data subgroup to a destination subgroup position.

23. A memory structure of changeable size as defined in claim 22, a memory controller having means for addressing the chips further comprising:
means for recognizing addressing components of a received processor requested address, including:
means for recognizing a minimum memory size address component from predetermined bit positions of a memory address for locating an M-bit group in the array on each chip in the memory structure,
a high-order address component adjacent to the minimum memory size address component in the memory address for selecting an extended address component that locates an N-bit subgroup in the located M-bit group on each of the chips.

24. A memory structure of changeable size as defined in claim 23, the memory controller further comprising:
means for recognizing a destination page address and a source page address received from the processor, clock pulse generating means,
means for subtracting the high-order address component of a destination page address from the high-order address component of a source page address to generate a pulse factor value, and multiplying or dividing the pulse factor value with a control value to obtain the number of shift pulses to be provided to the shifting register means to control the movement of a subgroup in the shifting means on each chip,
means for gating in parallel to the shifting means on the chips each shift pulse in the number of shift pulses determined by the subtracting means,
means for signalling a shift complete signal when the gating means indicates the last of the shift pulses determined by the subtracting means have been gated to the shifting means.

25. A memory structure of changeable size as defined in claim 24, the addressing means for each chip further comprising:
means for decoding the bits comprising the high-order address component in a received memory address for generating signals to each chip that address an N-bit subgroup to be accessed in an addressed M-bit group on the chip,
means for accessing the addressed N-bit subgroup when the signalling means provides a shift complete signal.

26. A memory structure of changeable size as defined in claim 25, the addressing means for each chip further comprising:
a memory size detector being set by a plurality of static signals set when the memory size is initially determined,
means connecting the static signals from the memory size detector to control the number of shift pulses to be determined and provided to the shifting means.

27. A memory structure of changeable size as defined in claim 26, the addressing means for each chip further comprising:
means connecting the static signals from the memory size detector to the decoding means to control the number of N-bit subgroups accessible in each M-bit group.

28. A memory structure of changeable size as defined in claim 27, the pulse generating means further comprising:
a decrementing binary counter being set to the value generated by the subtracting means,
clock pulses provided to the counter to decrement the values therein when the value is non-zero,
the gating means being enabled by an output of the decrementing binary counter when the counter setting is not at a zero value and the gating means being disabled as soon as the counter is decremented to the zero value to end a sequence of shift pulses and provide a shift complete signal.

29. A memory structure of changeable size as defined in claims 1 or 22, the shifting means further comprising:
a linear shift register for shifting by one bit position per shift actuation.

30. A memory structure of changeable size as defined in claims 1 or 22, the shifting means further comprising:
a shift register having parallel shift units for shifting one column unit position per shift actuation.

31. A memory structure of changeable size as defined in claims 1 or 22, the shifting means further comprising:
a shift register having parallel shift units for shifting one subgroup position per shift actuation.

32. A memory structure of changeable size as defined in claims 1 or 22, the shifting means further comprising:
a shift circuit for shifting a received subgroup to any subgroup position in a single shift actuation.

33. A page oriented memory structure of changeable size made of semiconductor chips for moving any data page from a source page frame address to a destination page frame address, the memory structure comprising:
a plurality of chips arranged in one or more storage sections (SSs), a plurality of addressable page frames located in all chips in the memory structure, each page frame located in all memory sections and having a subgroup of N bits in each M bit group on each chip in the memory structure,
a plurality of partitions in each storage section, the partitions comprised of different sets of chips in a storage section, each chip including a plurality of addressable groups,
memory control means for receiving a requested address to select one of the storage sections and one of the partitions containing the requested address for a data unit to be accessed in the partition, the memory control means selecting components of the requested address for performing a plurality of select operations in the memory structure,
a plane addressing means on each chip comprised of means for applying a group address provided by one of the address components to every chip in a partition,
subgroup selection means on each chip comprised of means for applying a subgroup address provided by subgroup address components to every chip in a partition,
means for registering the selected subgroup on each chip in the partition,
input/output (I/O) selector means controlled by a component of the requested memory address for selecting one or more data units from the selected subgroup in the registering means for every chip in the partition, and
memory bus means connected to the I/O selector means of every chip in the partition for transferring the selected data units.

34. A memory structure of changeable size as defined in claim 33, the memory structure further comprising:
one or more sections being added to the memory structure to increase the size of the memory by increasing the number of page frames contained in each addressable plane address on each chip in the memory structure by decreasing the number of bits on each chip allocated to each page frame.

35. A memory structure of changeable size as defined in claim 34, the registering means further comprising:
a shift register on each chip for receiving the selected subgroup to allow lateral movement of the subgroup between page frames having different lateral positions on the chip.

36. A memory structure of changeable size as defined in claim 35, the memory control means further comprising:
 page move addressing means for addressing a same source plane and source subgroup in all sections and partitions of the memory structure and for addressing a same destination plane and destination subgroup in all sections and partitions of the memory structure for moving a page from source page frame to destination page frame in the memory structure by moving the selected subgroup internally within every chip.

* * * * *